United States Patent
Shih

(10) Patent No.: US 11,063,012 B1
(45) Date of Patent: Jul. 13, 2021

(54) SEMICONDUCTOR STRUCTURE HAVING BUFFER UNDER BUMP PAD AND MANUFACTURING METHOD THEREOF

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/857,906

(22) Filed: Apr. 24, 2020

(51) Int. Cl.
*H01L 23/00* (2006.01)
*H01L 21/768* (2006.01)
*H01L 23/48* (2006.01)

(52) U.S. Cl.
CPC ........ *H01L 24/13* (2013.01); *H01L 21/76804* (2013.01); *H01L 23/481* (2013.01); *H01L 24/11* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,768,147 B2 * | 9/2017 | Gandhi | ................. | H01L 24/03 |
| 2011/0241185 A1 * | 10/2011 | Koester | ............... | H01L 23/552 |
| | | | | 257/659 |
| 2011/0309492 A1 * | 12/2011 | Chi | ....................... | H01L 24/05 |
| | | | | 257/737 |
| 2016/0013118 A1 * | 1/2016 | Tsai | ..................... | H01L 23/481 |
| | | | | 257/774 |
| 2016/0240462 A1 * | 8/2016 | Chen | ................ | H01L 23/49827 |
| 2019/0067244 A1 * | 2/2019 | Chen | .................. | H01L 23/3142 |
| 2020/0035595 A1 * | 1/2020 | Wu | ........................ | H01L 24/13 |
| 2020/0411379 A1 * | 12/2020 | Li | .......................... | H01L 24/13 |
| 2020/0411399 A1 * | 12/2020 | Wu | ........................ | H01L 23/28 |

* cited by examiner

*Primary Examiner* — Mamadou L Diallo
(74) *Attorney, Agent, or Firm* — Muncy, Geissler, Olds & Lowe, P.C.

(57) ABSTRACT

The present disclosure provides a semiconductor structure having an organic dielectric layer disposed under a bump pad and configured for stress relief, and a method of manufacturing the semiconductor structure. The semiconductor structure includes a substrate including a first surface and a second surface opposite to the first surface; a first dielectric layer disposed on the first surface of the substrate; a second dielectric layer disposed on the second surface of the substrate; a conductive via extending through the substrate and partially through the first dielectric layer and the second dielectric layer; a third dielectric layer disposed within the second dielectric layer and surrounding a portion of the conductive via; and a bump pad disposed over the third dielectric layer and the conductive via, wherein a dielectric constant of the third dielectric layer is substantially different from a dielectric constant of the second dielectric layer.

20 Claims, 21 Drawing Sheets

SEMICONDUCTOR STRUCTURE HAVING BUFFER UNDER BUMP PAD AND MANUFACTURING METHOD THEREOF

TECHNICAL FIELD

The present disclosure relates to a semiconductor structure, and a method of manufacturing the semiconductor structure.

Particularly, the present disclosure relates to a semiconductor structure having an organic dielectric layer disposed under a bump pad and configured for stress relief, and a method of manufacturing the semiconductor structure including disposing the organic dielectric layer and forming the bump pad over the organic dielectric layer.

DISCUSSION OF THE BACKGROUND

Semiconductor devices are used in a variety of electronic applications, such as personal computers, cellular telephones, digital cameras, and other electronic equipment. The fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve the integration density of the microelectronic components by continual reduction of minimum feature size, which allows more components to be integrated into a given area. Smaller package structures with smaller footprints are developed to package the semiconductor devices. For example, in an attempt to further increase density of the semiconductor device, three-dimensional (3D) integrated circuits including stacking of two or more components have been investigated. Such stacking may induce internal stress and may result in cracks in or damage to the elements of the package. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate including a first surface and a second surface opposite to the first surface; a first dielectric layer disposed on the first surface of the substrate; a second dielectric layer disposed on the second surface of the substrate; a conductive via extending through the substrate and partially through the first dielectric layer and the second dielectric layer; a third dielectric layer disposed within the second dielectric layer and surrounding a portion of the conductive via; and a bump pad disposed over the third dielectric layer and the conductive via, wherein a dielectric constant of the third dielectric layer is substantially different from a dielectric constant of the second dielectric layer.

In some embodiments, the dielectric constant of the third dielectric layer is substantially less than the dielectric constant of the second dielectric layer.

In some embodiments, the dielectric constant of the third dielectric layer is substantially less than or equal to 2.5.

In some embodiments, the dielectric constant of the second dielectric layer is substantially greater than 3.

In some embodiments, a hardness of the third dielectric layer is substantially less than a hardness of the second dielectric layer.

In some embodiments, the third dielectric layer is organic, and the second dielectric layer is inorganic.

In some embodiments, the third dielectric layer includes polyimides (PI), polytetrafluoroethene (PTFE), benzocyclobutene (BCB), polybenzobisoxazole (PBO) or polymer.

In some embodiments, the second dielectric layer includes silicon nitride, silicon oxide or silicon oxynitride.

In some embodiments, an interface is disposed between the second dielectric layer and the third dielectric layer.

In some embodiments, a thickness of the second dielectric layer is substantially greater than a thickness of the third dielectric layer.

In some embodiments, the bump pad includes a metallic liner disposed conformal to the third dielectric layer, a barrier layer disposed conformal to the metallic liner and over the conductive via, and a conductive member disposed over and surrounded by the barrier layer and the metallic liner.

In some embodiments, the bump pad is surrounded by the second dielectric layer and the third dielectric layer.

In some embodiments, the semiconductor structure further includes a conductive pad surrounded by the first dielectric layer and electrically coupled to the conductive via; and a conductive bump disposed on the bump pad and electrically connected to the conductive via through the bump pad.

Another aspect of the present disclosure provides a method of manufacturing a semiconductor structure. The method includes steps of providing a carrier; disposing an intermediate structure over the carrier, wherein the intermediate structure includes a first dielectric layer, a substrate over the first dielectric layer, and a conductive via extending partially through the substrate and the first dielectric layer; removing a first portion of the substrate to partially expose the conductive via; forming a second dielectric layer over the substrate and the conductive via exposed through the substrate; removing a second portion of the second dielectric layer to partially expose the conductive via; forming a third dielectric layer conformal to the second dielectric layer and the conductive via exposed through the second dielectric layer; and forming a bump pad surrounded by the third dielectric layer.

In some embodiments, the third dielectric layer is disposed by spin coating.

In some embodiments, at least a portion of the conductive via protrudes from the second dielectric layer after the removal of the second portion of the second dielectric layer.

In some embodiments, the formation of the third dielectric layer is performed after the formation of the second dielectric layer.

In some embodiments, the formation of the third dielectric layer and the formation of the second dielectric layer are performed separately.

In some embodiments, the semiconductor structure further includes removing a third portion of the third dielectric layer to partially expose the conductive via; removing the third dielectric layer from the substrate; forming a conductive bump on the bump pad; and removing the carrier from the first dielectric layer.

In some embodiments, the formation of the bump pad includes forming a metallic liner conformal to the third dielectric layer; removing a third portion of the third dielectric layer and a fourth portion of the metallic liner to partially expose the conductive via; forming a barrier layer conformal to the metallic liner and the conductive via; and disposing conductive material over the barrier layer to form a conductive member.

In conclusion, because a relatively soft dielectric layer is present under a bump pad, the dielectric layer can serve as a buffer for relieving or absorbing stress that develops during fabrication of a semiconductor structure. Therefore, crack development can be reduced or prevented. Reliability of the semiconductor structure can be improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by
> those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
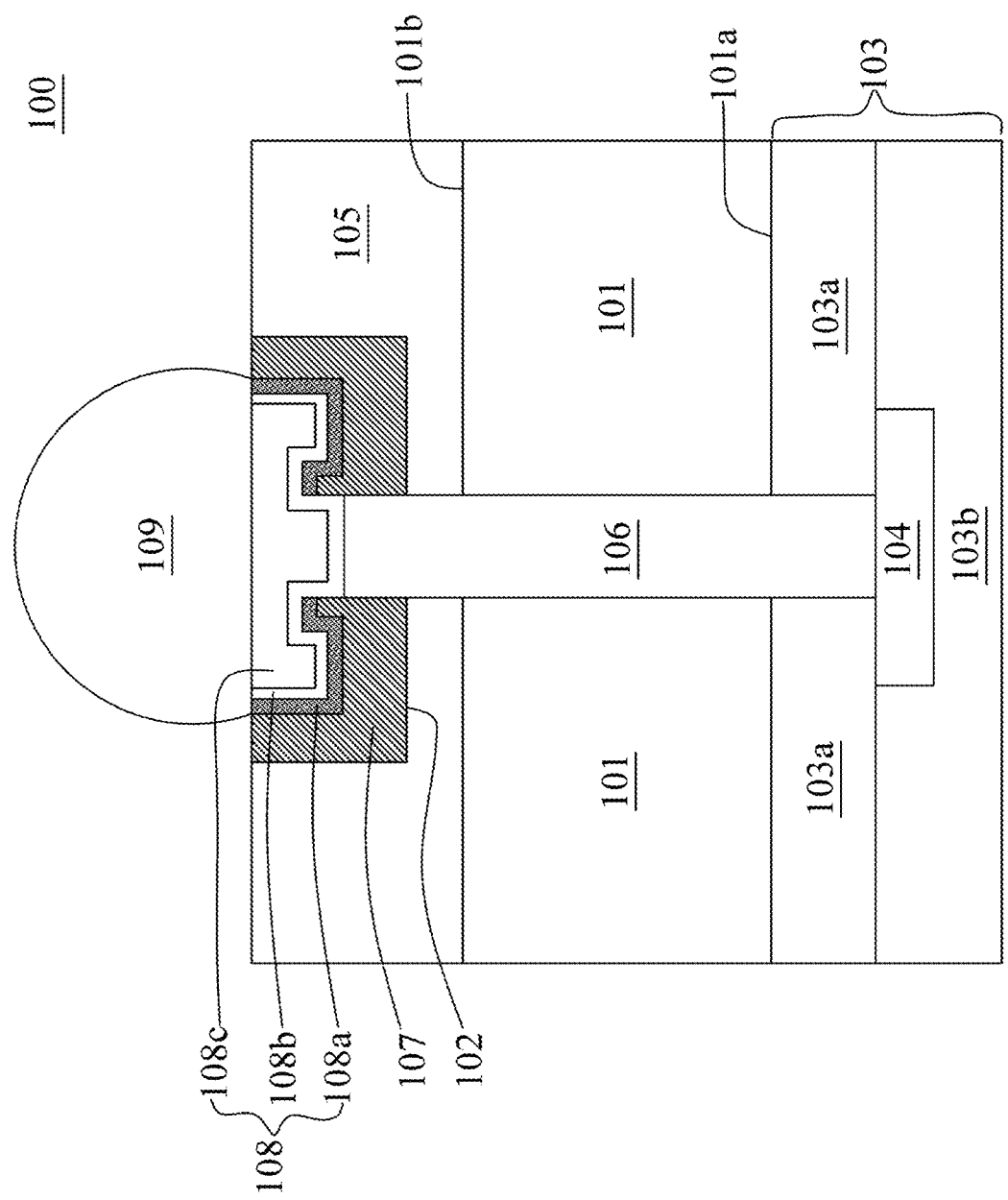
FIG. 1 is a cross-sectional view of a first semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a first semiconductor structure 100 in accordance with some embodiments of the present disclosure. In some embodiments, the first semiconductor structure 100 is a part of a die, a package or a device. In some embodiments, the first semiconductor structure 100 is a die, a package or a device. In some embodiments, the first semiconductor structure 100 is a flip chip package. In some embodiments, the first semiconductor structure 100 includes a substrate 101, a first dielectric layer 103, a second dielectric layer 105, a conductive via 106, a third dielectric layer 107 and a bump pad 108.

In some embodiments, the substrate 101 is a part of a wafer. In some embodiments, the substrate 101 is sawn from a wafer by dicing, cutting or another suitable operation. In some embodiments, the substrate 101 is a semiconductive layer. In some embodiments, the substrate 101 includes semiconductive material such as silicon, germanium, gallium, arsenic, or a combination thereof. In some embodiments, the substrate 101 is a silicon substrate.

In some embodiments, the substrate 101 includes a first surface 101a and a second surface 101b opposite to the first surface 101a. In some embodiments, the first surface 101a is a back side of the substrate 101, wherein a supporting substrate is disposed adjacent to the back side during fabrication of the first semiconductor structure 100. In some embodiments, the second surface 101b is a front side of the substrate 101, wherein electrical devices or components are subsequently formed over the second surface 101b and configured to electrically connect to an external circuitry.

In some embodiments, the first dielectric layer 103 is disposed on the substrate 101. In some embodiments, the first dielectric layer 103 is disposed on the first surface 101a of the substrate 101. In some embodiments, the first dielectric layer 103 includes dielectric material such as oxide, nitride, silicon dioxide, silicon nitride, silicon oxynitride, silicon carbide, polymer or the like.

In some embodiments, the first dielectric layer 103 includes several dielectric layers stacked over each other. In some embodiments, the first dielectric layer 103 includes a first layer 103a and a second layer 103b under the first layer 103a. In some embodiments, the first layer 103a and the second layer 103b include dielectric material. In some embodiments, each of the first layer 103a and the second layer 103b includes materials that are same as or different from materials in the other.

In some embodiments, a conductive pad 104 is included in the first semiconductor structure 100. In some embodiments, the conductive pad 104 is disposed within the first dielectric layer 103. In some embodiments, the conductive pad 104 is surrounded by the second layer 103b of the first dielectric layer 103. In some embodiments, the conductive pad 104 is disposed between the first layer 103a and the second layer 103b of the first dielectric layer 103.

In some embodiments, the conductive pad 104 laterally extends in the first dielectric layer 103. In some embodiments, the conductive pad 104 is configured to electrically connect to a die, a package or a circuitry external to the first semiconductor structure 100. In some embodiments, the conductive pad 104 includes conductive material such as gold, silver, copper, nickel, tungsten, aluminum, tin, alloys thereof or the like. In some embodiments, a top cross section of the conductive pad 104 has a circular or polygonal shape.

In some embodiments, the second dielectric layer 105 is disposed on the substrate 101. In some embodiments, the second dielectric layer 105 is disposed on the second surface 101b of the substrate 101. In some embodiments, the second dielectric layer 105 includes dielectric material such as oxide, nitride, silicon dioxide, silicon nitride, silicon oxynitride, silicon carbide or the like. In some embodiments, the second dielectric layer 105 includes inorganic material. In some embodiments, the second dielectric layer 105 is an inorganic layer.

In some embodiments, a dielectric constant (k) of the second dielectric layer 105 is substantially greater than 3. In some embodiments, the dielectric constant of the second dielectric layer 105 is substantially greater than 3.7. In some embodiments, the dielectric constant of the second dielectric layer 105 is substantially greater than 4. In some embodiments, the dielectric constant of the second dielectric layer 105 is substantially greater than a dielectric constant of silicon oxide.

In some embodiments, the second dielectric layer 105 includes several dielectric layers stacked over each other. In some embodiments, the second dielectric layer 105 includes a material that is same as or different from materials in the first dielectric layer 103. In some embodiments, a thickness of the second dielectric layer 105 is substantially equal to, greater than or less than a thickness of the first dielectric layer 103.

In some embodiments, the conductive via 106 extends through the substrate 101 and partially through the first dielectric layer 103 and the second dielectric layer 105. In some embodiments, the conductive via 106 is surrounded by the substrate 101, the first dielectric layer 103 and the second dielectric layer 105. In some embodiments, the conductive via 106 extends through the first layer 103a of the first dielectric layer 103 and the substrate 101.

In some embodiments, the conductive via 106 extends from and couples to the conductive pad 104. In some embodiments, the conductive via 106 is substantially orthogonal to the conductive pad 104. In some embodiments, the conductive via 106 is a through substrate via (TSV). In some embodiments, the conductive via 106 includes conductive material such as gold, silver, copper, nickel, tungsten, aluminum, tin, alloys thereof or the like. In some embodiments, a top cross section of the conductive via 106 has a circular or polygonal shape. In some embodiments, the conductive via 106 has a cylindrical shape.

In some embodiments, the third dielectric layer 107 is disposed within the second dielectric layer 105 and surrounds a portion of the conductive via 106. In some embodiments, the third dielectric layer 107 at least contacts an end portion of the conductive via 106. In some embodiments, at least a portion or a surface of the third dielectric layer 107 is exposed through the second dielectric layer 105.

In some embodiments, the third dielectric layer 107 includes dielectric material such as polyimides (PI), polytetrafluoroethene (PTFE), benzocyclobutene (BCB), polybenzobisoxazole (PBO), polymer or the like. In some embodiments, the third dielectric layer 107 includes organic material. In some embodiments, the third dielectric layer 107 is an organic layer.

In some embodiments, a dielectric constant (k) of the third dielectric layer 107 is substantially different from the dielectric constant of the second dielectric layer 105. In some embodiments, the dielectric constant of the third dielectric layer 107 is substantially less than the dielectric constant of the second dielectric layer 105. In some embodiments, the third dielectric layer 107 includes low-k dielectric material. In some embodiments, the dielectric constant of the third dielectric layer 107 is substantially less than or equal to 2.5. In some embodiments, the dielectric constant of the third dielectric layer 107 is substantially less than or equal to 2. In some embodiments, the dielectric constant of the third dielectric layer 107 is substantially less than a dielectric constant of silicon oxide.

In some embodiments, a hardness of the third dielectric layer 107 is substantially less than a hardness of the second dielectric layer 105. In some embodiments, a Young's modulus of the third dielectric layer 107 is substantially less than the Young's modulus of the second dielectric layer 105. In some embodiments, the third dielectric layer 107 is softer than the second dielectric layer 105.

In some embodiments, an interface 102 is disposed between the second dielectric layer 105 and the third dielectric layer 107. In some embodiments, a thickness of the second dielectric layer 105 is substantially greater than a thickness of the third dielectric layer 107.

In some embodiments, the bump pad 108 is disposed over the third dielectric layer 107 and the conductive via 106. In some embodiments, the bump pad 108 is surrounded by the second dielectric layer 105 and the third dielectric layer 107. In some embodiments, the bump pad 108 is conformal to the third dielectric layer 107 and contacts the conductive via 106. In some embodiments, the bump pad 108 contacts the end portion of the conductive via 106.

In some embodiments, the bump pad 108 is configured to receive a conductive structure such as a conductive bump, a solder ball or the like. In some embodiments, the bump pad 108 is electrically connected to the conductive pad 104 through the conductive via 106. In some embodiments, the bump pad 108 is electrically coupled to the conductive via 106.

In some embodiments, the bump pad 108 is a metal layer or a metal stack film above the third dielectric layer 107 and the second dielectric layer 105. In some embodiments, the bump pad 108 includes conductive material such as gold, silver, copper, nickel, tungsten, aluminum, palladium or the like.

In some embodiments, the bump pad 108 includes a metallic liner 108a disposed conformal to the third dielectric layer 107, a barrier layer 108b disposed conformal to the metallic liner 108a and over the conductive via 106, and a conductive member 108c disposed over and surrounded by the barrier layer 108b and the metallic liner 108a.

In some embodiments, the metallic liner 108a is disposed over the third dielectric layer 107. In some embodiments, at least a portion or a surface of the metallic liner 108a is exposed through the second dielectric layer 105. In some embodiments, the metallic liner 108a is an adhesion layer. In some embodiments, the metallic liner 108a includes metal such as titanium, tungsten or the like.

In some embodiments, the barrier layer 108b is disposed over the metallic liner 108a and the end portion of the conductive via 106. In some embodiments, the barrier layer 108b contacts a surface of the end portion of the conductive via 106. In some embodiments, the barrier layer 108b includes titanium, titanium nitride, tantalum, tantalum nitride, nickel or the like.

In some embodiments, the conductive member 108c is disposed over the barrier layer 108b. In some embodiments, a seed layer may be disposed between the barrier layer 108b and the conductive member 108c. In some embodiments, the seed layer includes titanium, copper, nickel, gold or the like. In some embodiments, the seed layer includes two kinds of conductive materials such as titanium and copper. In some embodiments, the conductive member 108c is disposed over the seed layer.

In some embodiments, the conductive member 108c is surrounded by the second dielectric layer 105, the third dielectric layer 107, the metallic layer 108a and the barrier layer 108b. In some embodiments, a surface of the conductive member 108c is exposed and is configured to receive a conductive structure such as a conductive bump, a solder ball or the like. In some embodiments, the surface of the conductive member 108c is substantially coplanar with a surface of the second dielectric layer 105 and a surface of the third dielectric layer 107. In some embodiments, the conductive member 108c includes conductive material such as gold, silver, copper, nickel, tungsten, aluminum, palladium or the like.

In some embodiments, a conductive bump 109 is included in the first semiconductor structure 100. In some embodiments, the conductive bump 109 is disposed on the bump pad 108 and electrically connected to the conductive via 106 through the bump pad 108. In some embodiments, the conductive bump 109 is disposed on the conductive member 108c of the bump pad 108. In some embodiments, the conductive bump 109 contacts the metallic liner 108a, the barrier layer 108b and the conductive member 108c.

In some embodiments, the conductive bump 109 includes conductive material such as lead, tin, copper, gold, nickel or the like. In some embodiments, the conductive bump 109 is a ball grid array (BGA) ball, controlled collapse chip connection (C4) bump, micro-bump, pillar or the like. Since a relatively soft third dielectric layer 107 is present under the bump pad 108, the third dielectric layer 107 can serve as a buffer layer for relieving or absorbing stress that develops during formation of the conductive bump 109 on the bump pad 108 or during bonding of the conductive bump 109 to an external structure.

Figure 2:
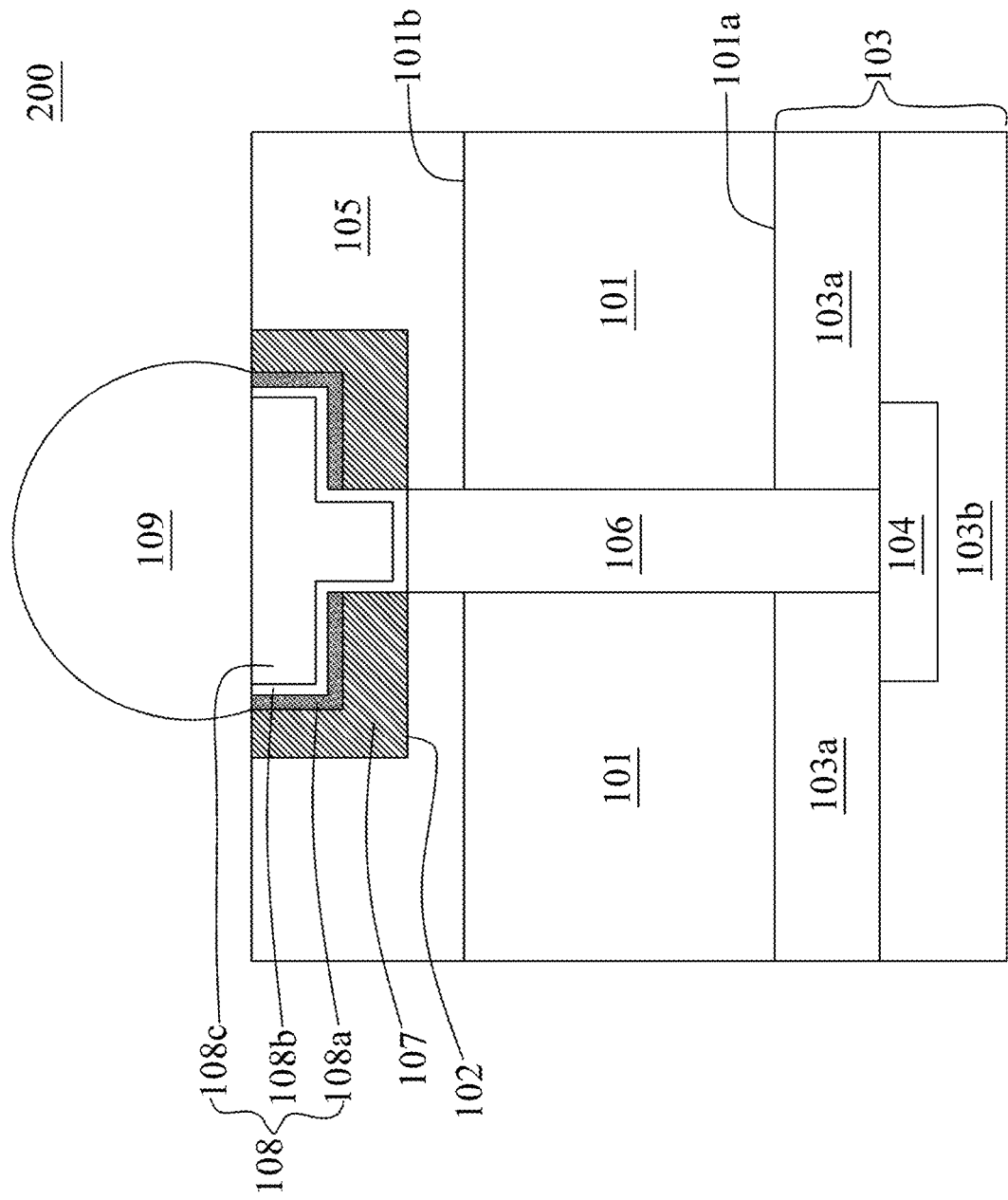
FIG. 2 is a cross-sectional view of a second semiconductor structure in accordance with some embodiments of the present disclosure.

FIG. 2 is a schematic cross-sectional view of a second semiconductor structure 200 in accordance with some embodiments of the present disclosure. In some embodiments, the second semiconductor structure 200 has a configuration similar to that of the first semiconductor structure 100, except that, in the second semiconductor structure 200, a bottom surface of the third dielectric layer 107 is higher than or coplanar with a top surface of the conductive via 106.

In some embodiments, the conductive via 106 is not surrounded by the third dielectric layer 107. In some embodiments, the third dielectric layer 107 surrounds only the bump pad 108. In some embodiments, the surface of the end portion of the conductive via 106 is substantially coplanar with a bottom surface of the third dielectric layer 107.

Figure 3:
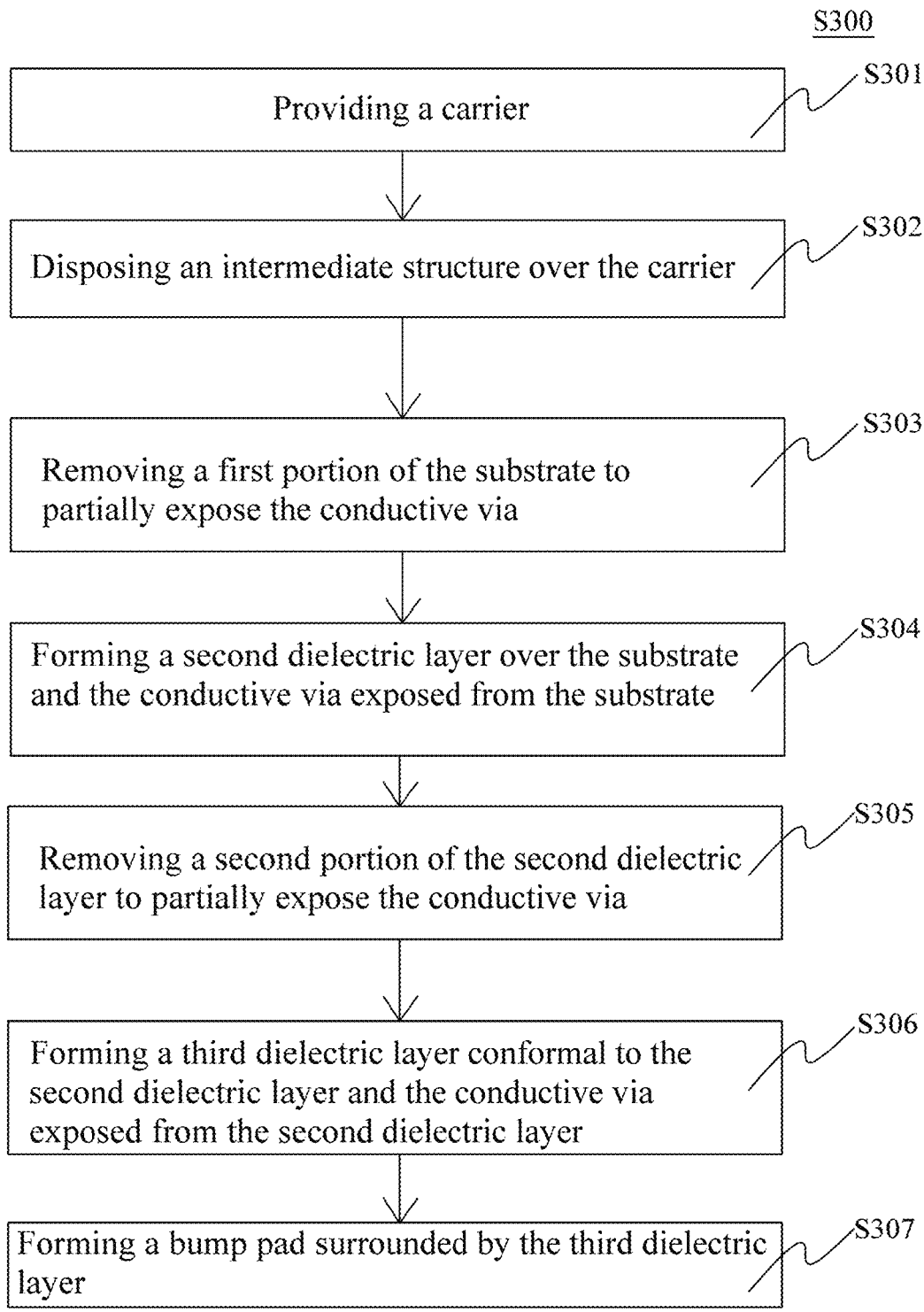
FIG. 3 is a flow diagram illustrating a method of manufacturing a semiconductor structure in accordance with some embodiments of the present disclosure.

FIG. 3 is a flow diagram illustrating a method S300 of manufacturing a first semiconductor structure 100 in accordance with some embodiments of the present disclosure, and FIGS. 4 through 21 illustrate cross-sectional views of intermediate stages in the formation of the first semiconductor structure 100 in accordance with some embodiments of the present disclosure.

The stages shown in FIGS. 4 to 21 are also illustrated schematically in the flow diagram in FIG. 3. In the following discussion, the fabrication stages shown in FIGS. 4 to 21 are discussed in reference to the process steps shown in FIG. 3. The method S300 includes a number of operations and the description and illustration are not deemed as a limitation as the sequence of the operations. The method S300 includes a number of steps (S301, S302, S303, S304, S305, S306 and S307).

Figure 4:
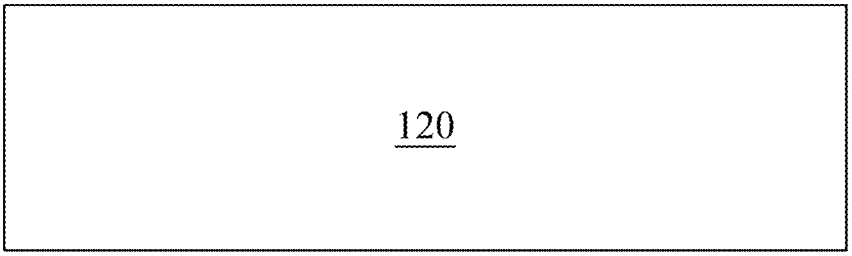
FIGS. 4 through 21 illustrate cross-sectional views of intermediate stages in the formation of a semiconductor structure in accordance with some embodiments of the present disclosure.

Referring to FIG. 4, a carrier 120 is provided according to a step S301 in FIG. 3. In some embodiments, the carrier 120 is a carrier substrate or carrier wafer serving as a base for supporting a component, circuitry, wafer or substrate. In some embodiments, the carrier 120 is a blank glass carrier, ceramic carrier or the like.

Figure 5:
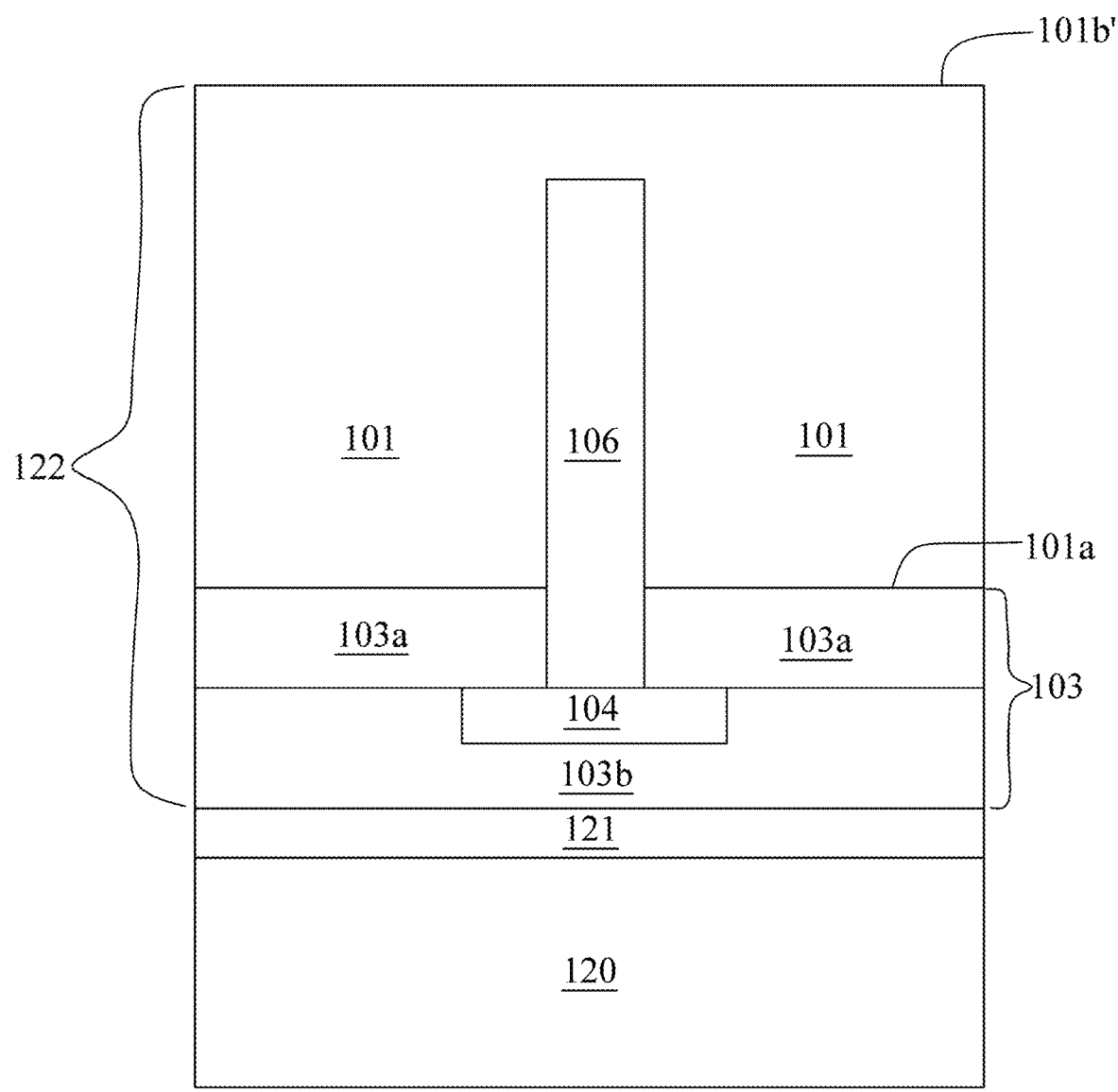

Referring to FIG. 5, an intermediate structure 122 is disposed over the carrier 120 according to a step S302 in FIG. 3. In some embodiments, the intermediate structure 122 is adhered to the carrier 120 by an adhesive 121 such as light-to-heat-conversion (LTHC) release coating, ultraviolet (UV) glue, die attach film (DAF), a polymeric material, or the like.

In some embodiments, the intermediate structure 122 includes a first dielectric layer 103, a substrate 101 over the first dielectric layer 103, and a conductive via 106 extending partially through the substrate 101 and the first dielectric layer 103. In some embodiments, the first dielectric layer 103 is disposed on a first surface 101a of the substrate 101. In some embodiments, the first dielectric layer 103 includes dielectric material such as oxide, nitride, silicon dioxide, silicon nitride, silicon oxynitride, silicon carbide, polymer or the like. In some embodiments, the first dielectric layer 103 is temporarily adhered to the carrier 120 by the adhesive 121. In some embodiments, the first dielectric layer 103 has a configuration similar to that of the dielectric layer described above or illustrated in FIG. 1 or 2.

In some embodiments, the substrate 101 is disposed over the first dielectric layer 103. In some embodiments, the substrate 101 includes semiconductive material such as silicon, germanium, gallium, arsenic, or a combination thereof. In some embodiments, the substrate 101 is a silicon substrate. In some embodiments, the substrate 101 includes a first surface 101a and a pre-treated second surface 101b' opposite to the first surface 101a. In some embodiments, the first dielectric layer 103 is disposed on the first surface 101a of the substrate 101.

In some embodiments, the conductive via 106 is disposed within and surrounded by the substrate 101 and the first dielectric layer 103. In some embodiments, the conductive via 106 extends through a first layer 103a of the first dielectric layer 103. In some embodiments, the conductive via 106 extends from a conductive pad 104 surrounded by a second layer 103b of the first dielectric layer 103. In some embodiments, the conductive via 106 has a configuration similar to that of the conductive via described above or illustrated in FIG. 1 or 2.

Figure 6:
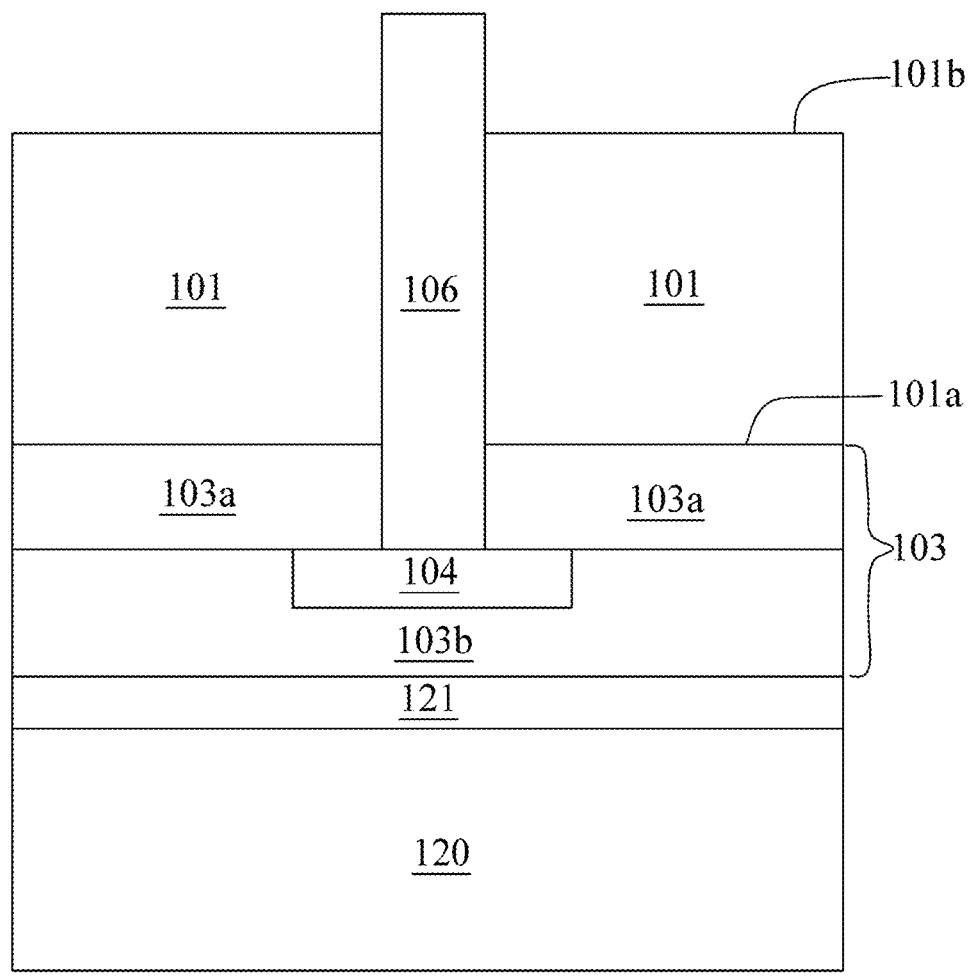

Referring to FIG. 6, a first portion of the substrate 101 is removed to partially expose the conductive via 106 according to a step S303 in FIG. 3. In some embodiments, the first portion of the substrate 101 is removed, and a second surface 101b is formed. In some embodiments, an end portion of the conductive via 106 is exposed after the removal of the first portion of the substrate 101.

In some embodiments, at least a top surface of the conductive via 106 is exposed through the substrate 101 after the removal of the first portion of the substrate 101. In some embodiments, the first portion of the substrate 101 can be removed by etching, grinding or another suitable operation. In some embodiments, the substrate 101 has a configuration similar to that of the substrate described above or illustrated in FIG. 1 or 2.

Figure 7:
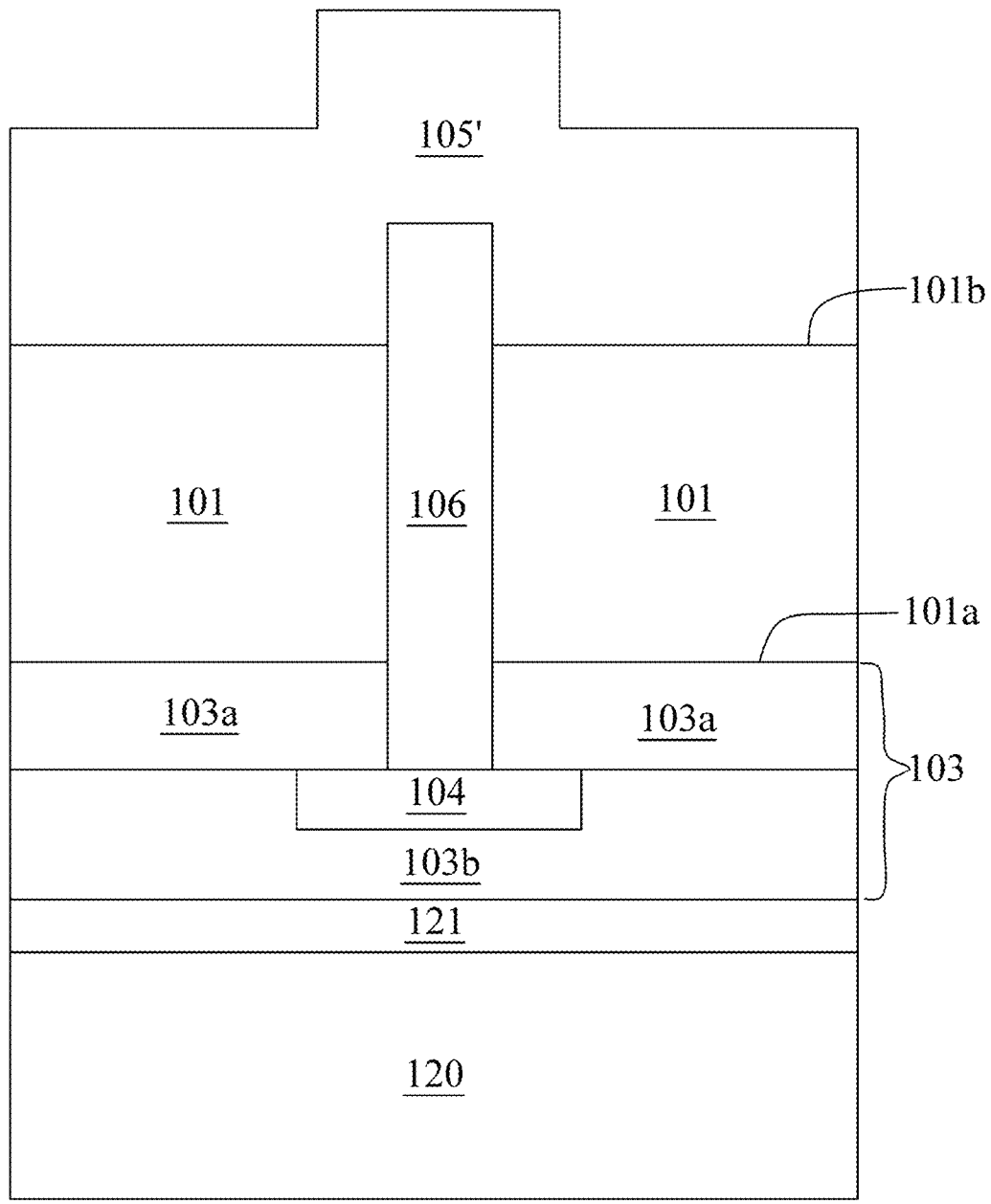
Figure 8:
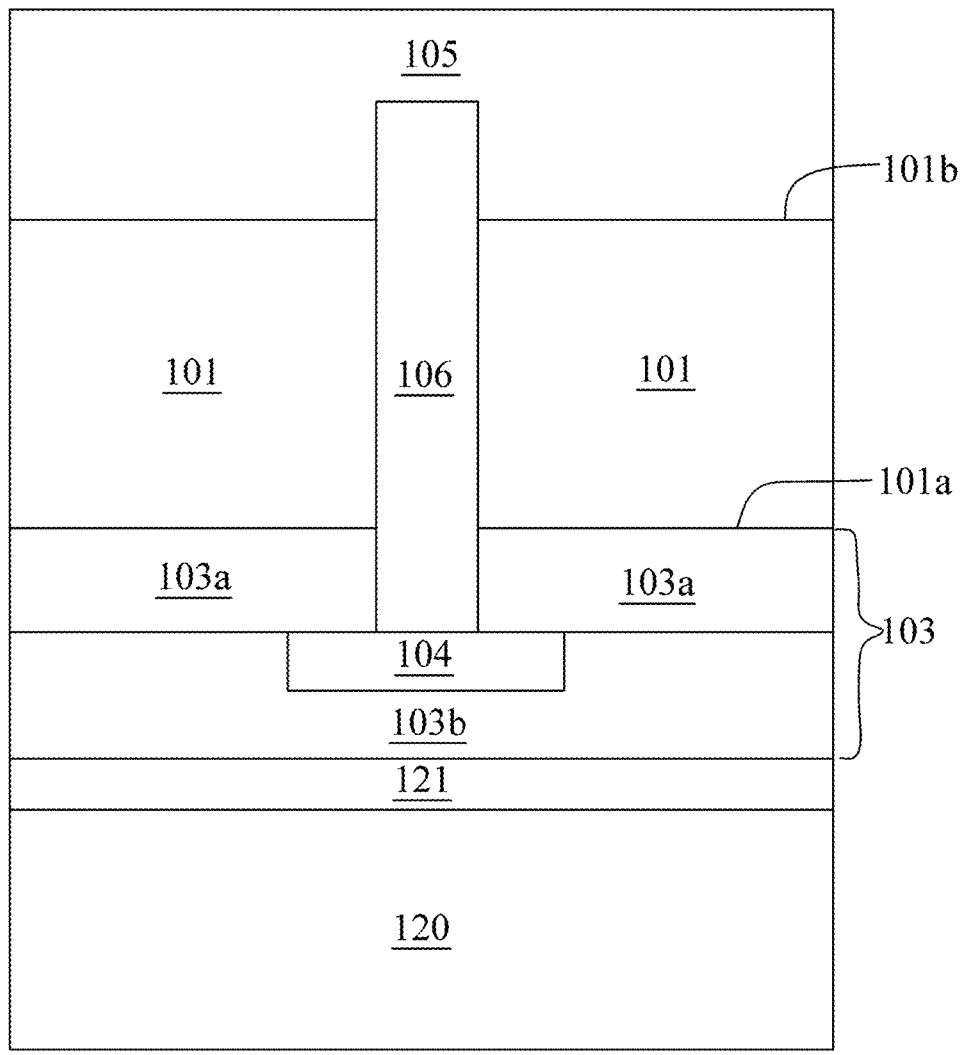

Referring to FIGS. 7 to 8, a second dielectric layer 105 is formed over the substrate 101 and a portion of the conductive via 106 exposed through the substrate 101 according to a step S304 in FIG. 3. In some embodiments, a second dielectric material 105' is disposed over the substrate 101 and covers the conductive via 106. In some embodiments, the second dielectric material 105' is disposed conformal to the second surface 101b of the substrate 101 and the portion of the conductive via 106 protruding from the substrate 101, so that a protrusion of the second dielectric material 105' is formed above the conductive via 106. In some embodiments, the second dielectric material 105' is disposed by deposition, chemical vapor deposition (CVD) or another suitable operation.

In some embodiments, the second dielectric material 105' includes oxide, nitride, silicon dioxide, silicon nitride, silicon oxynitride, silicon carbide or the like. In some embodiments, the second dielectric material 105' is inorganic. In some embodiments, a dielectric constant (k) of the second dielectric material 105' is substantially greater than 3. In some embodiments, the dielectric constant of the second dielectric material 105' is substantially greater than 3.7. In some embodiments, the dielectric constant of the second dielectric material 105' is substantially greater than 4. In some embodiments, the dielectric constant of the second dielectric material 105' is substantially greater than a dielectric constant of silicon oxide.

In some embodiments, after the disposing of the second dielectric material 105', the second dielectric material 105' is planarized to become a second dielectric layer 105 as shown in FIG. 8. In some embodiments, the planarization of the second dielectric material 105' includes removing the protrusion of the second dielectric material 105'. In some embodiments, the planarization of the second dielectric material 105' can be implemented by grinding, etching, chemical mechanical polishing (CMP) or another suitable operation. In some embodiments, the second dielectric material 105' is planarized to yield an acceptably flat topology.

Figure 9:
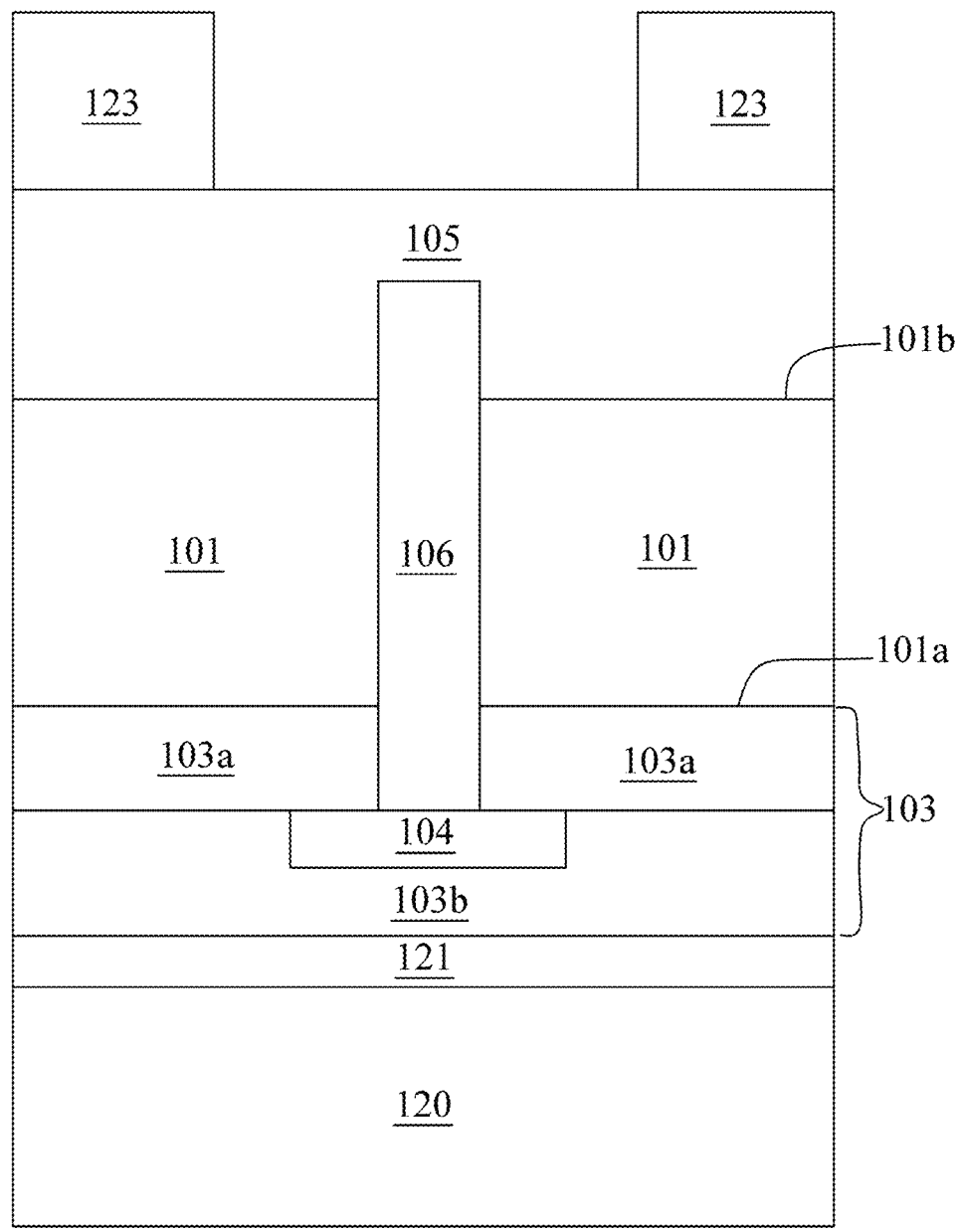
Figure 10:
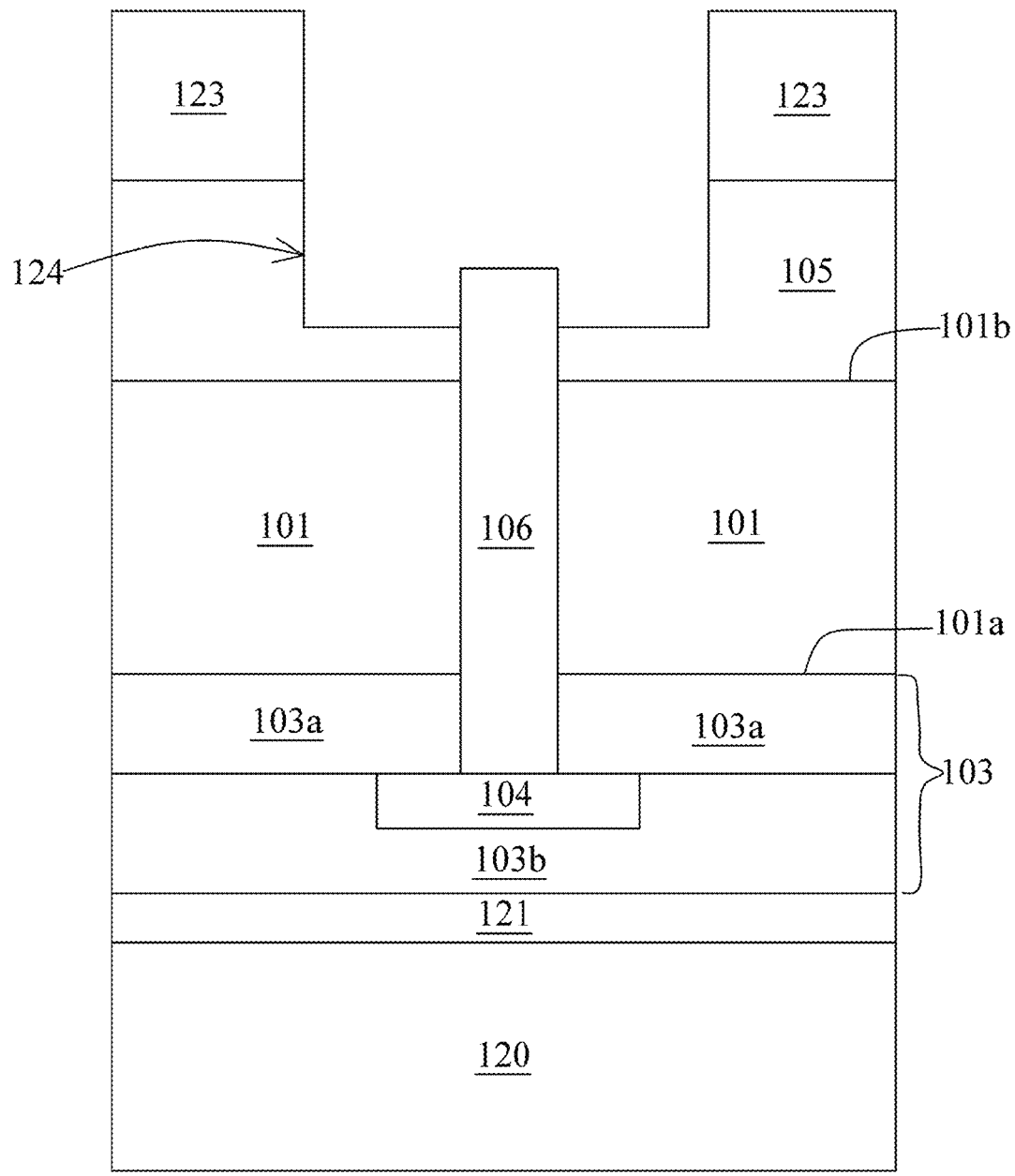
Figure 11:
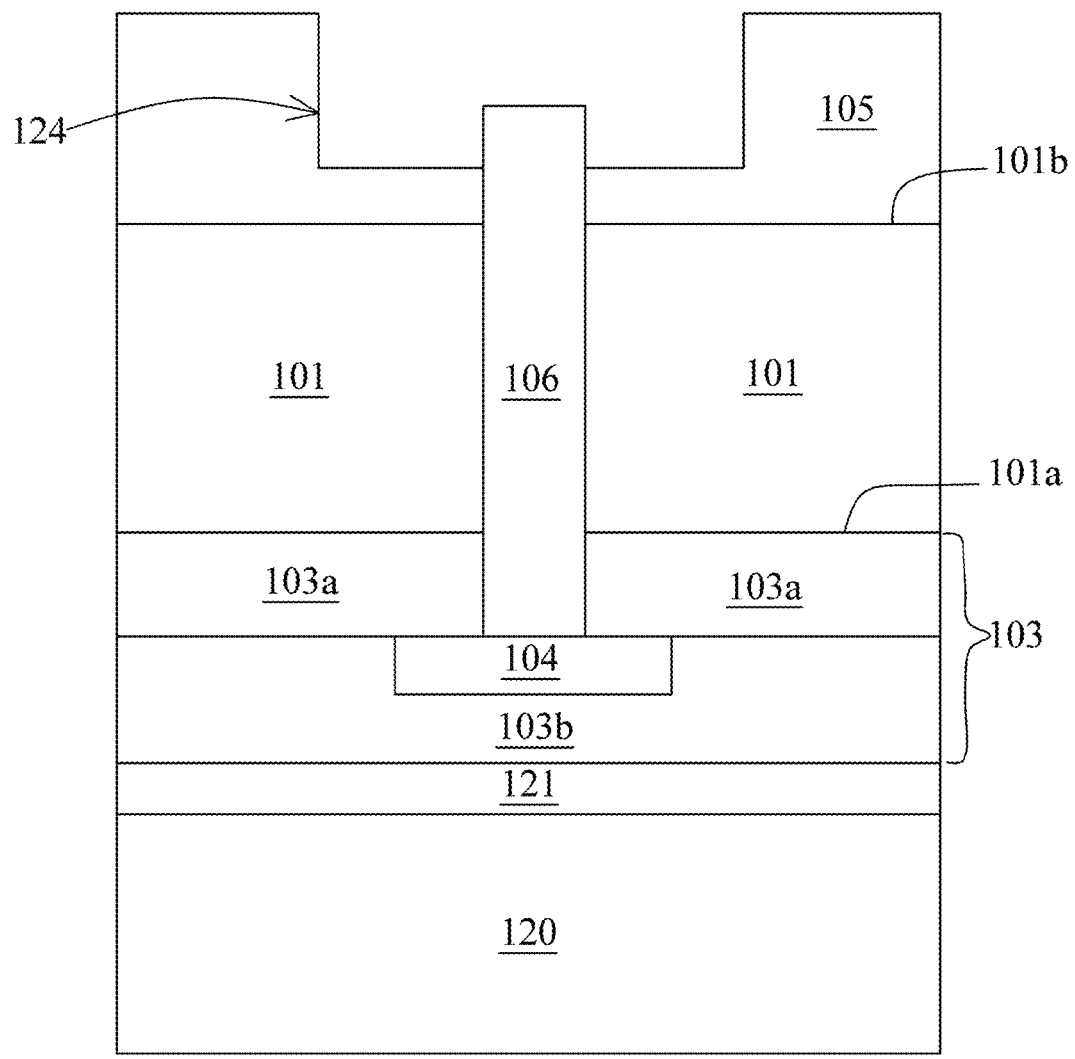

Referring to FIGS. 9 to 11, a second portion of the second dielectric layer 105 is removed to partially expose the conductive via 106 according to a step S305 in FIG. 3. In some embodiments, the second portion of the second dielectric layer 105 can be removed by photolithography, etching or another suitable operation. In some embodiments, the removal of the second portion of the second dielectric layer 105 includes disposing a first patterned photoresist 123 over the second dielectric layer 105, and then removing the second portion of the second dielectric layer 105 to form a first recess 124 and partially expose the conductive via 106. In some embodiments, at least a portion of the conductive via 106 protrudes from the second dielectric layer 105 after the removal of the second portion of the second dielectric layer 105.

In some embodiments, the first patterned photoresist 123 is formed by performing an exposure process and a develop process on a photoresist material. In some embodiments, the first patterned photoresist 123 is removed after the formation of the first recess 124. In some embodiments, the first patterned photoresist 123 can be removed by stripping, etching or another suitable operation. In some embodiments, the second dielectric layer 105 has a configuration similar to that of the dielectric layer described above or illustrated in FIG. 1 or 2.

Figure 12:
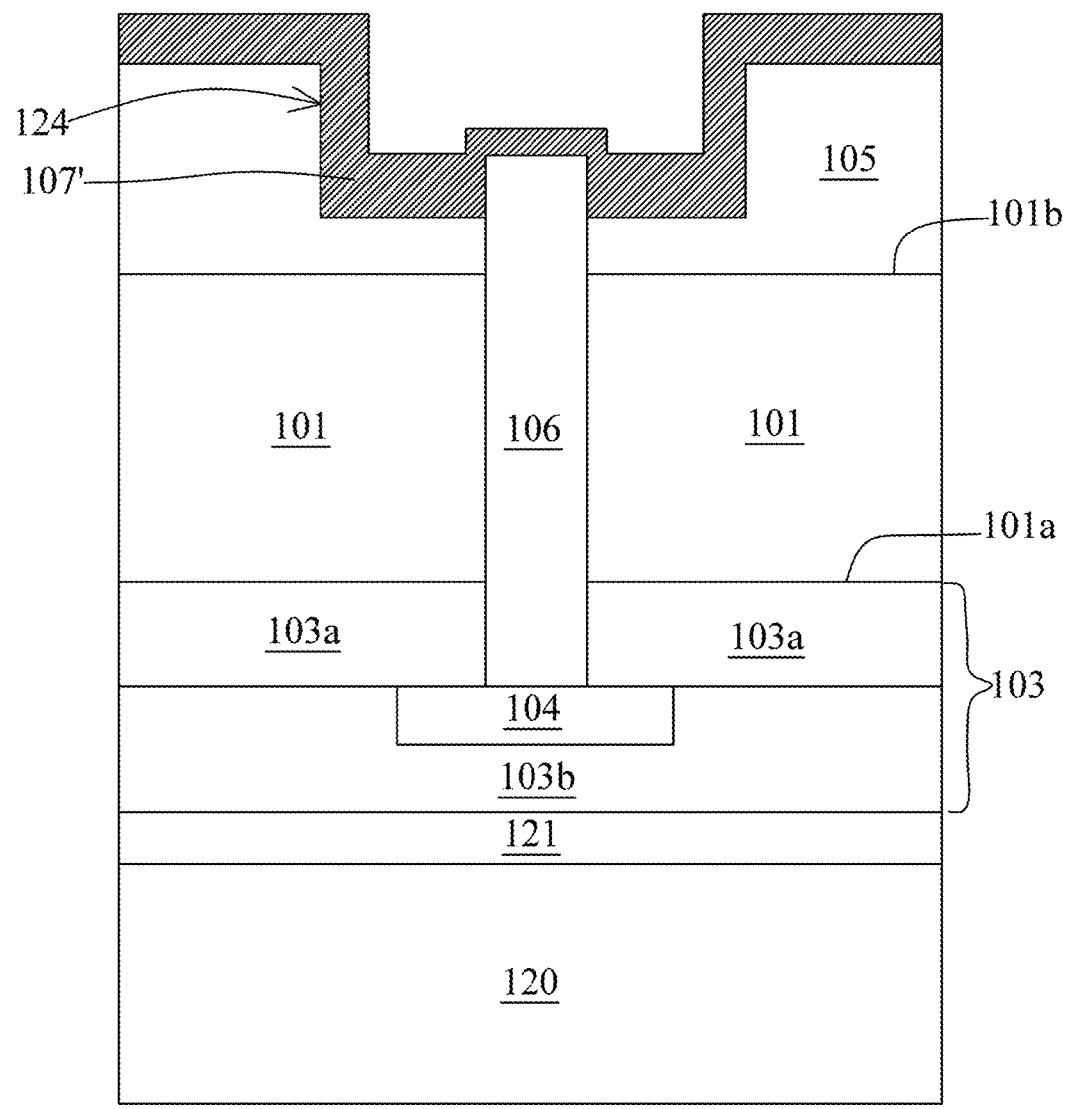

Referring to FIG. 12, a third dielectric material 107' is disposed over the second dielectric layer 105 and the conductive via 106 according to a step S306 in FIG. 3. In some embodiments, the third dielectric material 107' is disposed conformal to the second dielectric layer 105, the first recess 124 and the conductive via 106 protruding from the second dielectric layer 105. In some embodiments, the third dielectric material 107' is disposed by spin coating, CVD or another suitable operation.

In some embodiments, the disposing of the third dielectric material 107' is performed after the disposing of the second dielectric material 105' and the formation of the second dielectric layer 105. In some embodiments, the disposing of the third dielectric material 107' and the disposing of the second dielectric material 105' are performed separately.

In some embodiments, the third dielectric material 107' includes polyimides (PI), polytetrafluoroethene (PTFE), benzocyclobutene (BCB), polybenzobisoxazole (PBO), polymer or the like. In some embodiments, the third dielectric material 107' is organic.

In some embodiments, a dielectric constant (k) of the third dielectric material 107' is substantially different from the dielectric constant of the second dielectric layer 105. In some embodiments, the dielectric constant of the third dielectric material 107' is substantially less than the dielectric constant of the second dielectric layer 105. In some embodiments, the third dielectric material 107' includes low-k dielectric material.

In some embodiments, the dielectric constant of the third dielectric material 107' is substantially less than or equal to 2.5. In some embodiments, the dielectric constant of the third dielectric material 107' is substantially less than or equal to 2. In some embodiments, the dielectric constant of the third dielectric material 107' is substantially less than a dielectric constant of silicon oxide.

In some embodiments, a hardness of the third dielectric material 107' is substantially less than a hardness of the second dielectric layer 105. In some embodiments, a Young's modulus of the third dielectric material 107' is substantially less than the Young's modulus of the second dielectric layer 105. In some embodiments, the third dielectric material 107' is softer than the second dielectric layer 105.

Figure 13:
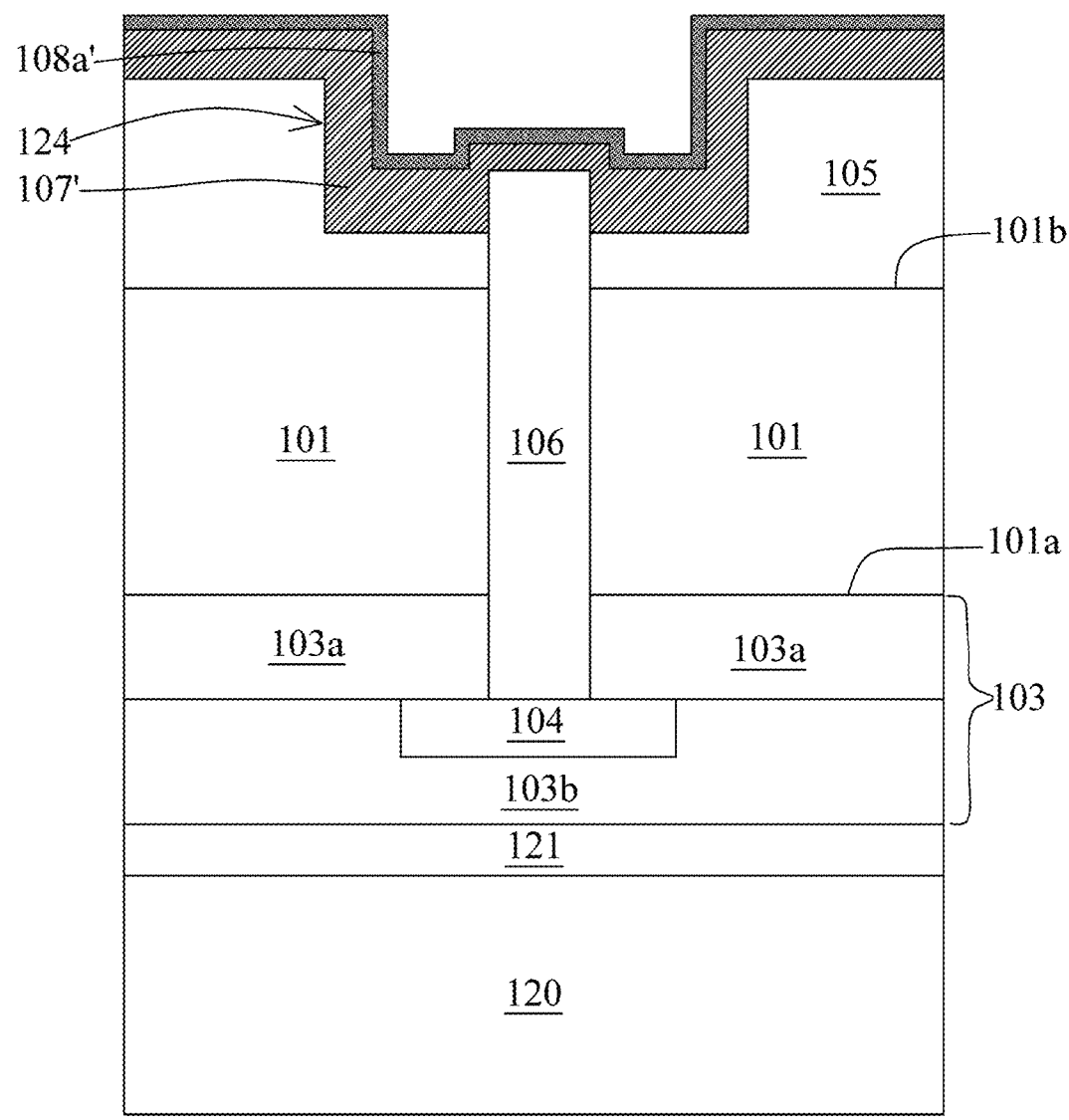
Figure 14:
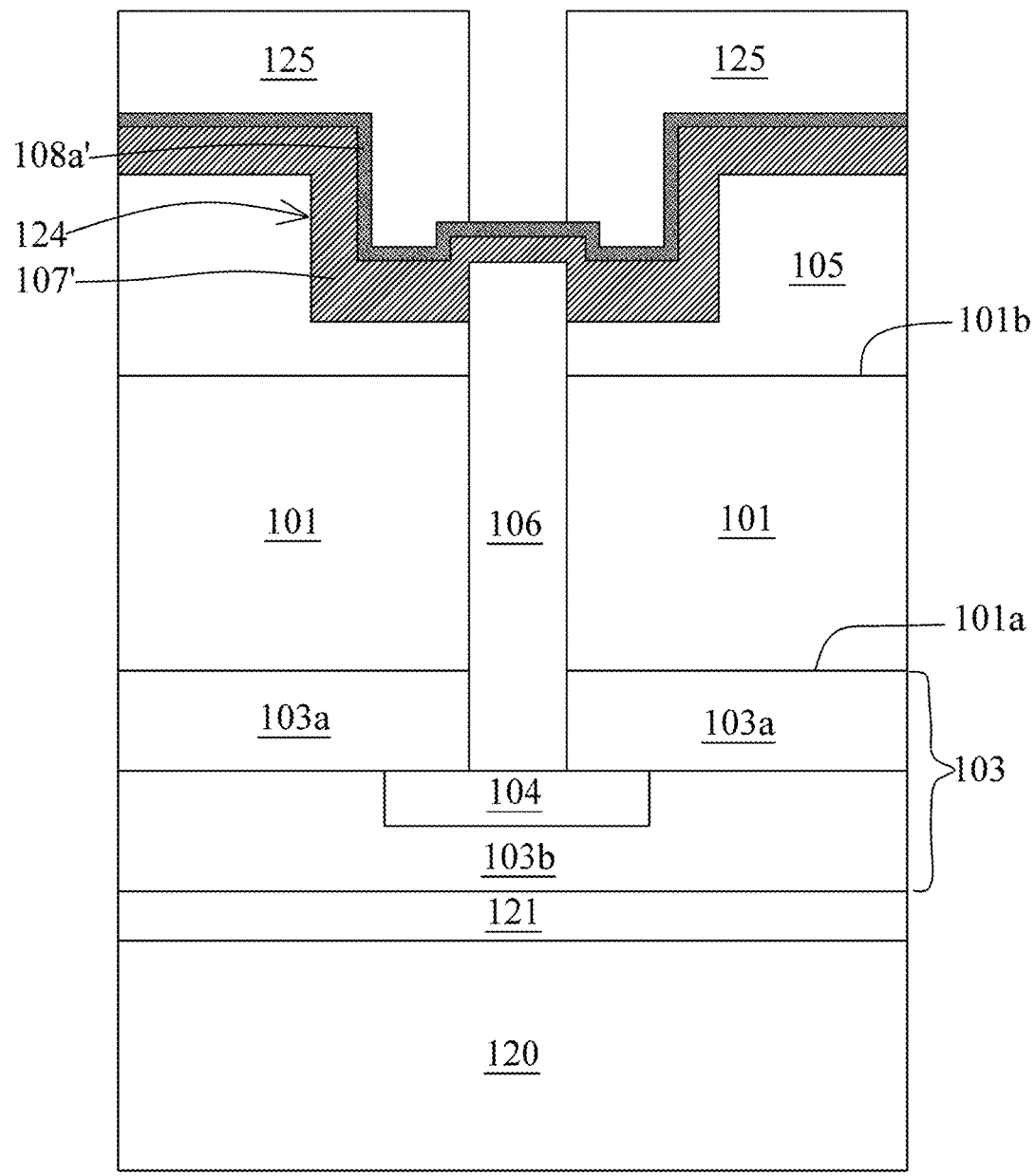
Figure 15:
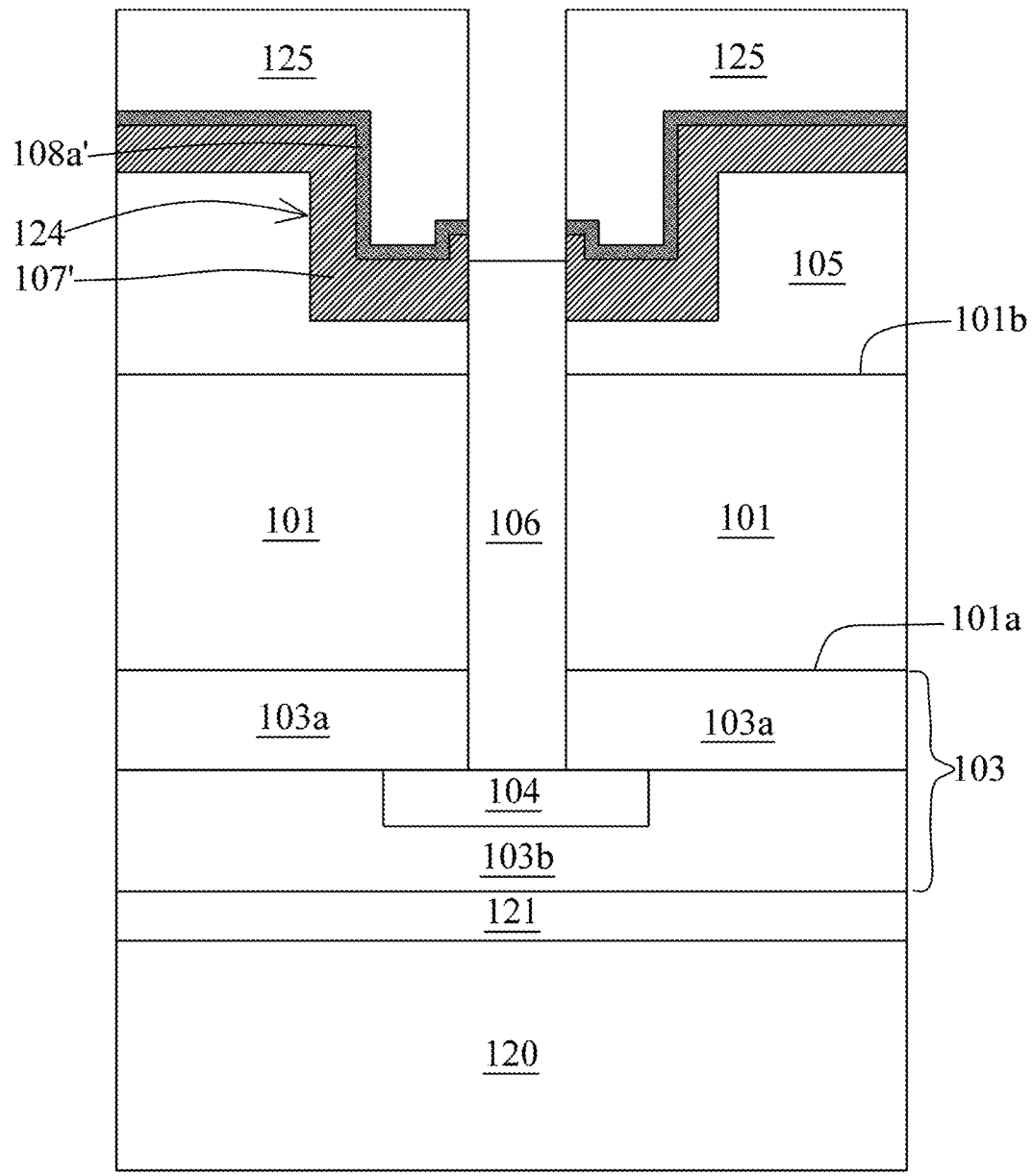
Figure 16:
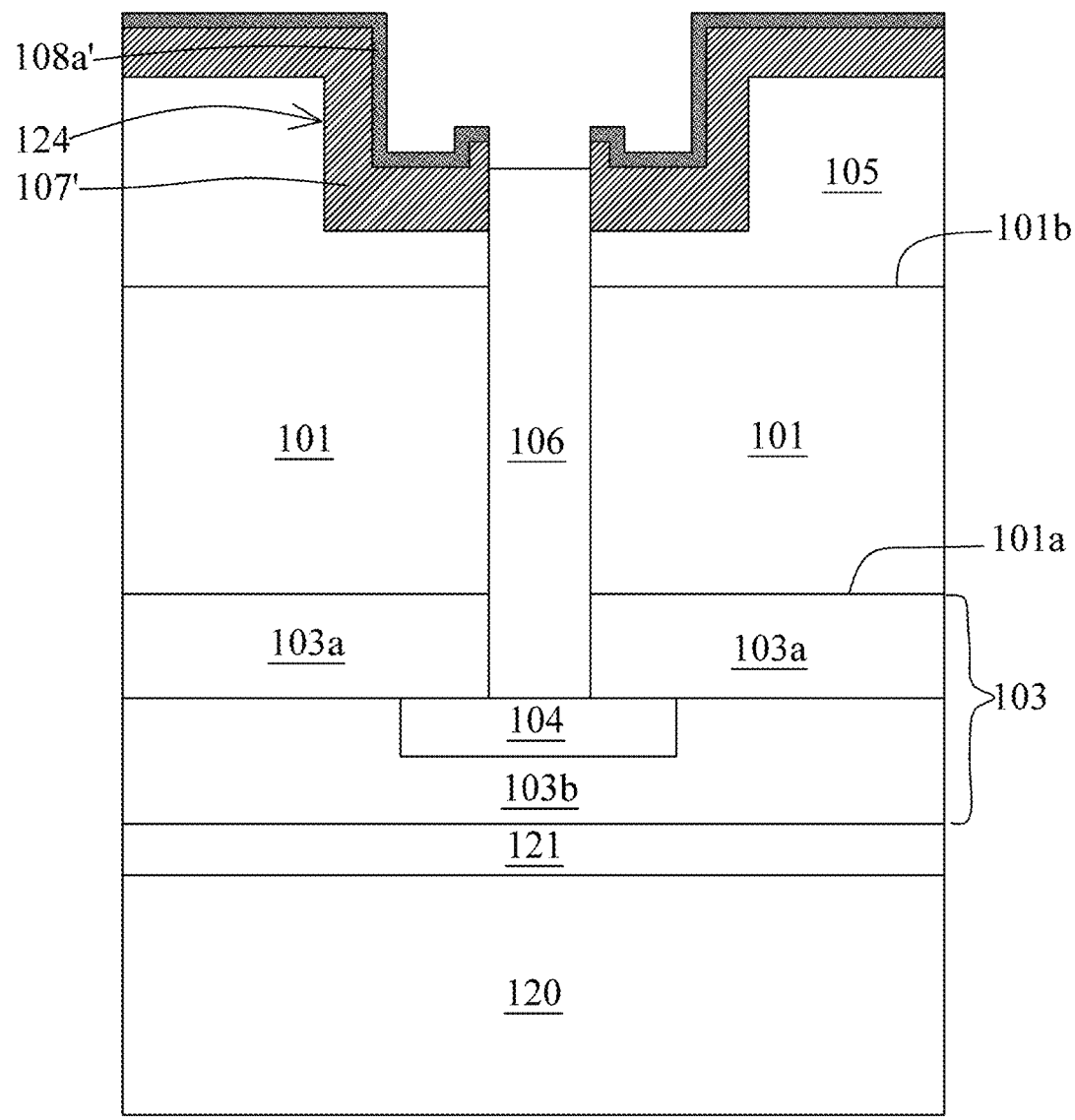
Figure 17:
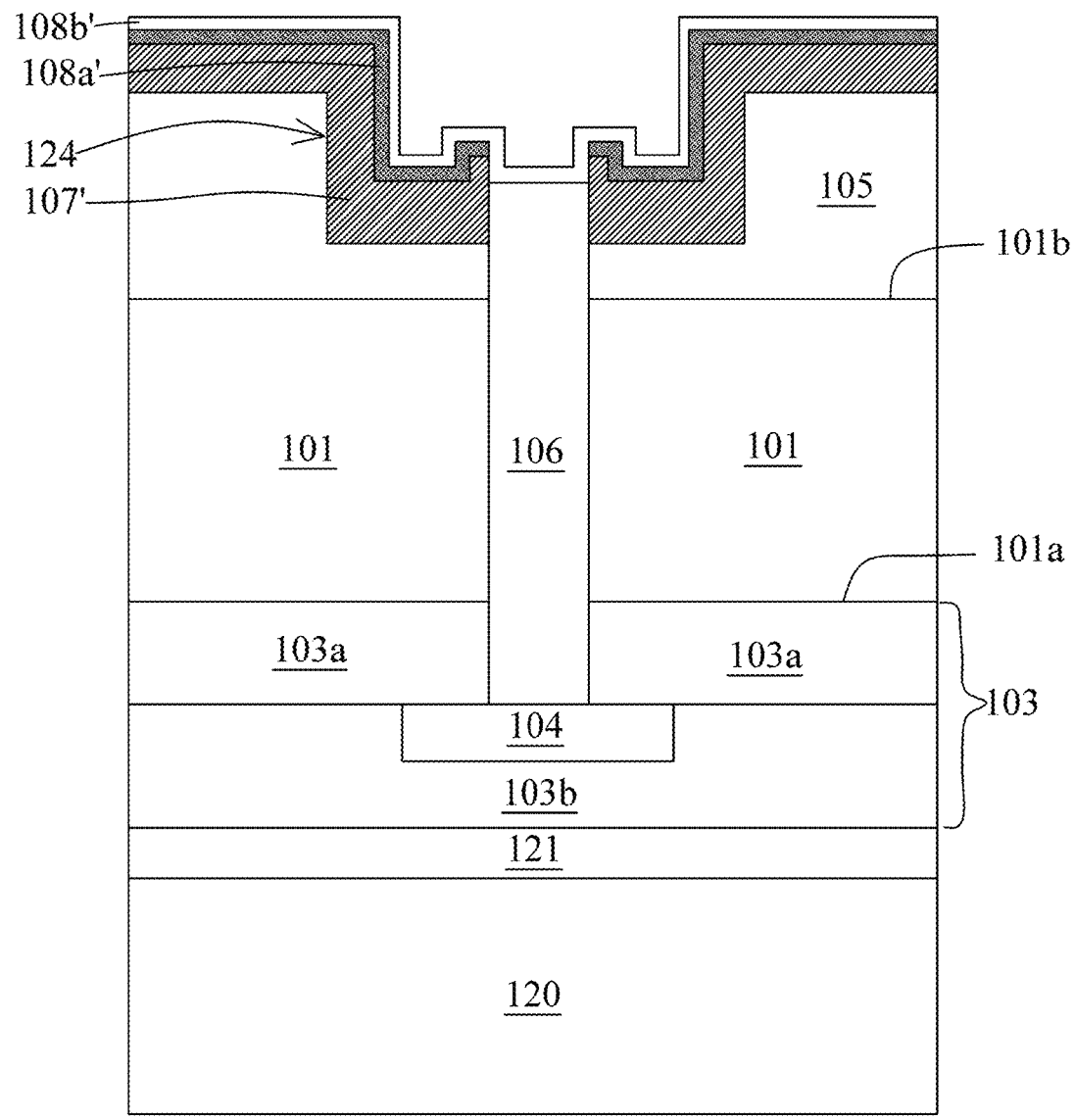
Figure 18:
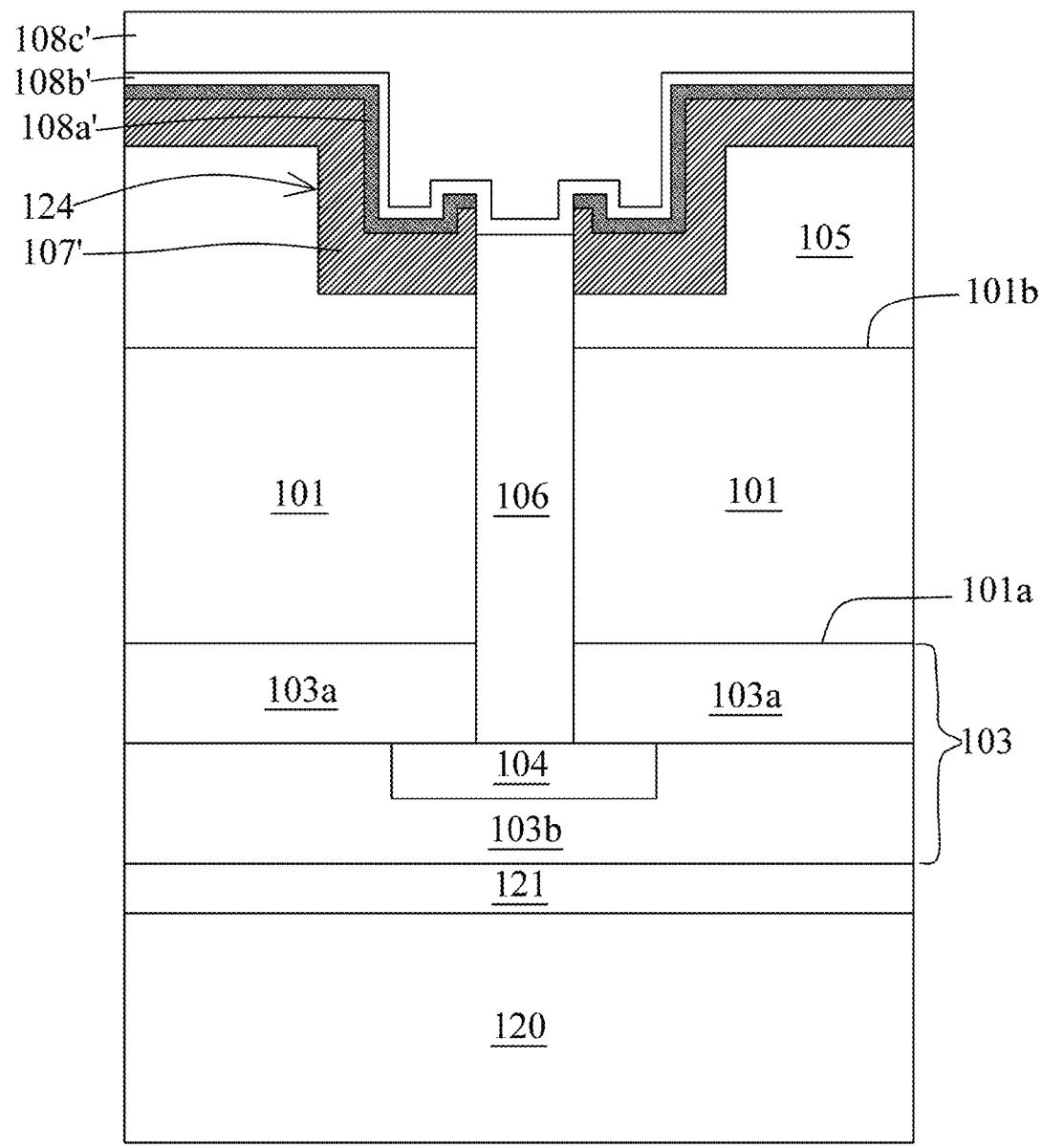
Figure 19:
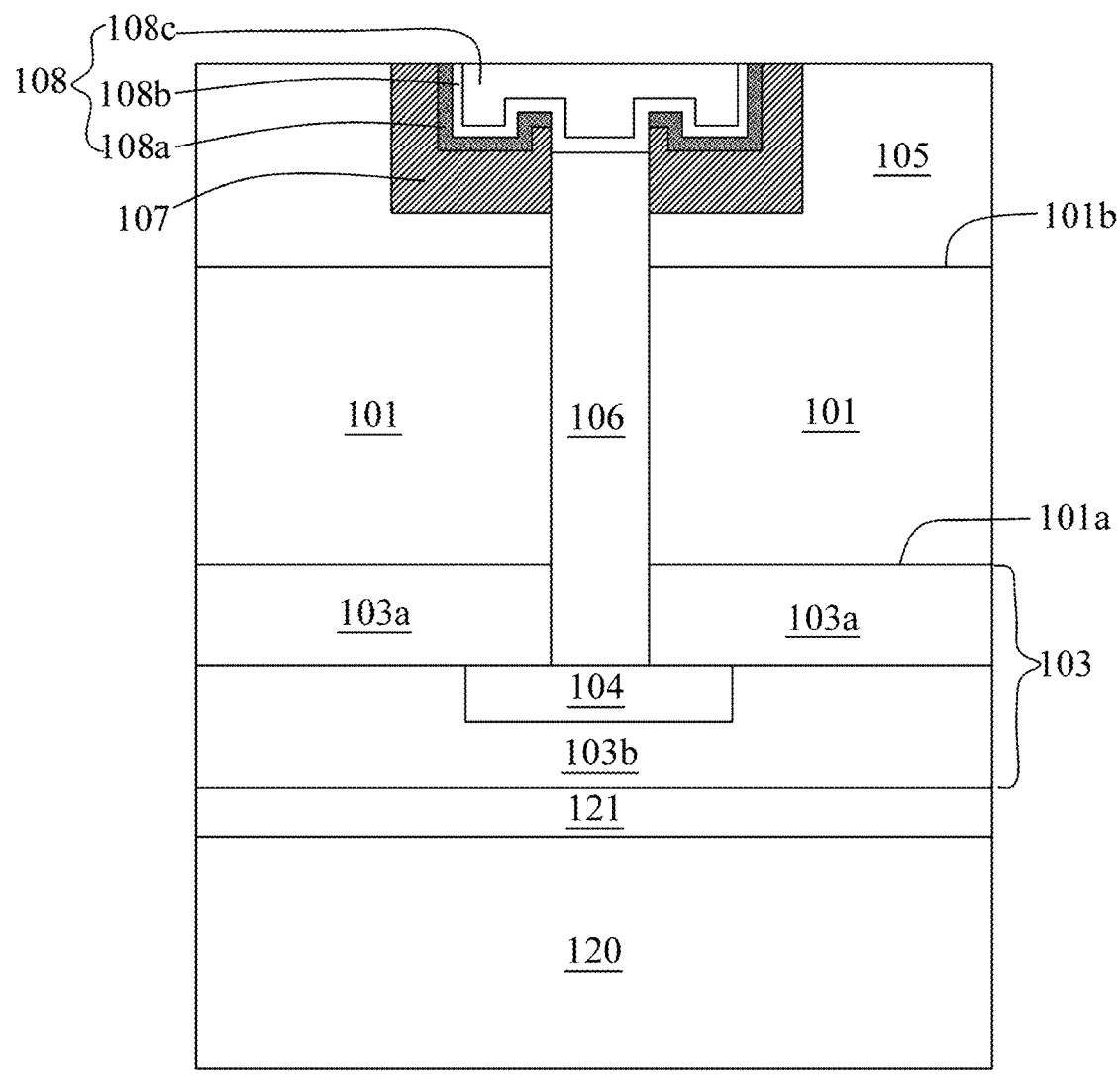

Referring to FIGS. 13 to 19, a bump pad 108 is formed according to a step S307 in FIG. 3. In some embodiments, the formation of the bump pad 108 includes disposing a metallic material 108a' conformal to the third dielectric material 107' as shown in FIG. 13, disposing a second patterned photoresist 125 over the metallic material 108a' as shown in FIG. 14, removing a portion of the third dielectric material 107' and the metallic material 108a' disposed on the conductive via 106 as shown in FIG. 15, removing the second patterned photoresist 125 as shown in FIG. 16, disposing a barrier material 108b' conformal to the metallic material 108a' and the conductive via 106 as shown in FIG. 17, disposing a conductive material 108c' over the barrier material 108b' as shown in FIG. 18, and removing a portion of the metallic material 108a', the barrier material 108b' and the conductive material 108c' on the second dielectric layer 105 to form a metallic liner 108a, a barrier layer 108b and a conductive member 108c as shown in FIG. 19.

Referring to FIG. 13, the metallic material 108a' is disposed conformal to the third dielectric material 107'. In some embodiments, the metallic material 108a' includes metal such as titanium, tungsten or the like. In some embodiments, the metallic material 108a' is disposed by deposition, sputtering or another suitable operation.

Referring to FIG. 14, after the disposing of the metallic material 108a', the second patterned photoresist 125 is disposed over the metallic material 108a'. In some embodiments, the second patterned photoresist 125 is formed by performing an exposure process and a develop process on a photoresist material.

Referring to FIG. 15, after the disposing of the second patterned photoresist 125, a third portion of the third dielectric material 107' and a fourth portion of the metallic material 108a' exposed through the second patterned photoresist 125 are removed to partially expose the conductive via 106. In some embodiments, the third portion of the third dielectric material 107' and the fourth portion of the metallic material 108a' can be removed by photolithography, etching or another suitable operation. In some embodiments, the top surface of the conductive via 106 is exposed after the removal of the third portion of the third dielectric material 107' and the fourth portion of the metallic material 108a'.

Referring to FIG. 16, after the removal of the third portion of the third dielectric material 107' and the fourth portion of the metallic material 108a, the second patterned photoresist 125 is removed. In some embodiments, the second patterned photoresist 125 can be removed by stripping, etching or another suitable operation.

Referring to FIG. 17, after the removal of the second patterned photoresist 125, the barrier material 108b' is disposed conformal to the metallic material 108a' and the portion of the conductive via 106 exposed through the metallic material 108a' and the third dielectric material 107'. In some embodiments, the barrier material 108b' can be disposed by atomic layer deposition (ALD), CVD, plasma-enhanced CVD (PECVD) or the like. In some embodiments, the barrier material 108b' includes titanium, titanium nitride, tantalum, tantalum nitride, nickel or the like.

Referring to FIG. 18, after the disposing of the barrier material 108b', the conductive material 108c' is disposed over the barrier material 108b'. In some embodiments, the conductive material 108c' is disposed by sputtering, electroplating or another suitable operation. In some embodiments, the conductive material 108c' includes gold, silver, copper, nickel, tungsten, aluminum, palladium or the like.

Referring to FIG. 19, after the disposing of the conductive material 108c', the portion of the third dielectric material 107', the metallic material 108a', the barrier material 108b' and the conductive material 108c' disposed over the second dielectric layer 105 are removed. In some embodiments, the portion of the third dielectric material 107', the metallic material 108a', the barrier material 108b' and the conductive material 108c' disposed over the second dielectric layer 105 can be removed by grinding, etching, CMP or another suitable operation.

In some embodiments, after the removal of the portion of the third dielectric material 107', the metallic material 108a', the barrier material 108b' and the conductive material 108c', the third dielectric layer 107 and the bump pad 108 including the metallic liner 108a, the barrier layer 108b and the conductive member 108c are formed.

In some embodiments, the bump pad 108 is surrounded by the third dielectric layer 107. In some embodiments, the metallic liner 108a is formed conformal to the third dielectric layer 107. In some embodiments, the barrier layer 108b is formed conformal to the metallic liner 108a and the conductive via 106. In some embodiments, the conductive member 108c is surrounded by the third dielectric layer 107, the metallic liner 108a and the barrier layer 108b.

In some embodiments, the bump pad 108 is electrically connected to the conductive pad 104 through the conductive via 106. In some embodiments, the third dielectric layer 107, the bump pad 108, the metallic liner 108a, the barrier layer 108b and the conductive member 108c have configurations similar to those of similar components described above or illustrated in FIG. 1 or 2.

Figure 20:
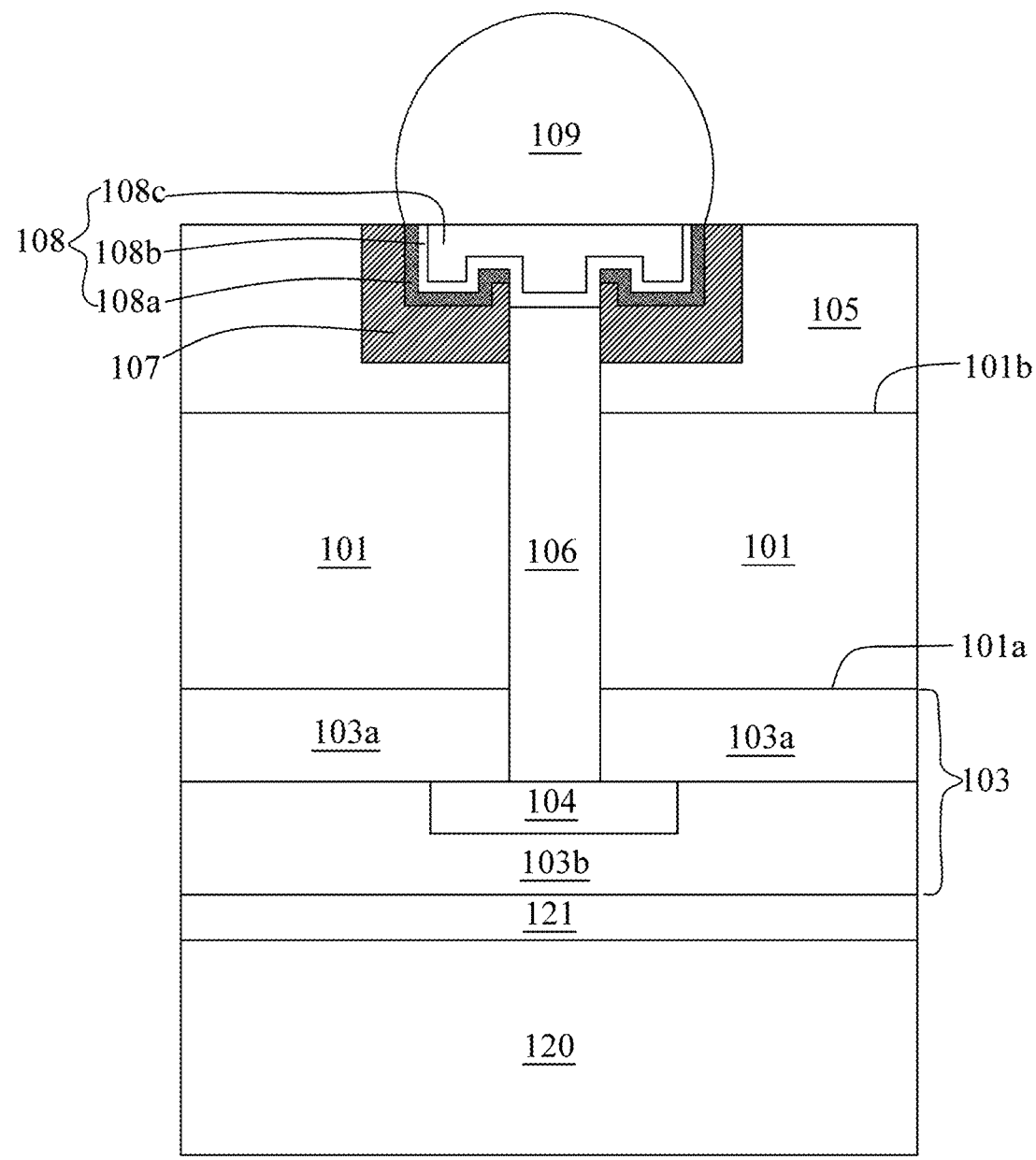

After the formation of the bump pad 108, a conductive bump 109 is formed on the bump pad 108 as shown in FIG. 20. In some embodiments, the conductive bump 109 is formed on the conductive member 108c of the bump pad 108. In some embodiments, the conductive bump 109 contacts the metallic liner 108a, the barrier layer 108b and the conductive member 108c.

In some embodiments, the conductive bump 109 can be formed by ball dropping, solder pasting, stencil printing or another suitable operation. In some embodiments, the conductive bump 109 includes conductive material such as lead, tin copper, gold, nickel or the like. In some embodiments, the conductive bump 109 is a ball grid array (BGA) ball, controlled collapse chip connection (C4) bump, microbump, pillar or the like. In some embodiments, the conductive bump 109 has a configuration similar to that of the conductive bump described above or illustrated in FIG. 1 or 2.

Figure 21:
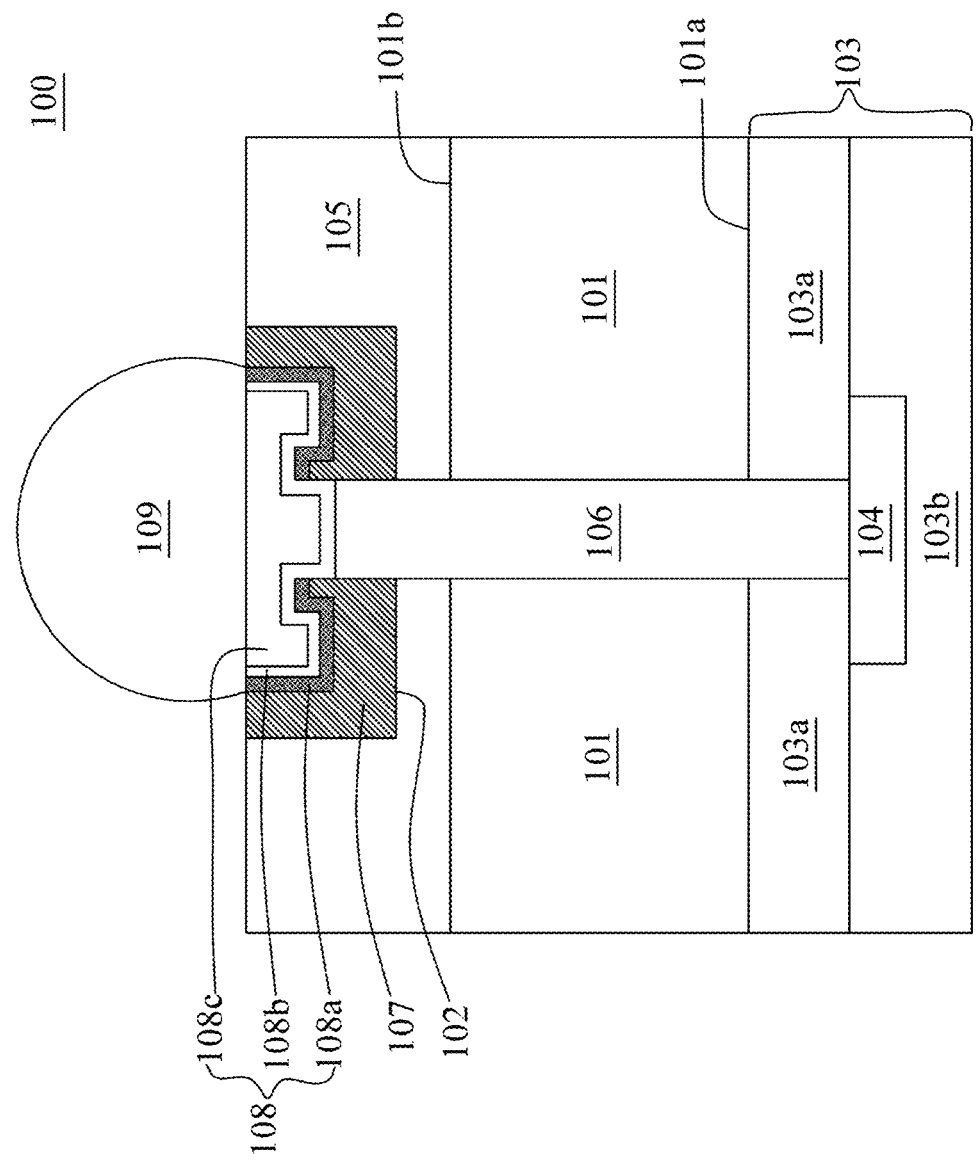

After the formation of the conductive bump 109, the carrier 120 is removed as shown in FIG. 21. In some embodiments, the carrier 120 can be removed by decomposing the adhesive 121, grinding the carrier 120 or another suitable debonding operation. For example, the carrier 120 can be removed after heating the adhesive 121 or exposing the adhesive 121 to a predetermined electromagnetic radiation such as UV radiation. In some embodiments, the first semiconductor structure 100 as illustrated in FIG. 1 is formed after the removal of the carrier 120. In some embodiments, an interface 102 is formed between the second dielectric layer 105 and the third dielectric layer 107.

In conclusion, a relatively soft third dielectric layer 107 is formed under the bump pad 108, and the third dielectric layer 107 can serve as a buffer for relieving or absorbing stress that develops during fabrication of a semiconductor structure such as formation of the conductive bump 109 on the bump pad 108 or bonding of the conductive bump 109 to an external structure. The third dielectric layer 107 can absorb the internal stress, and therefore cracks that develop within the semiconductor structure can be reduced or prevented. As such, reliability and overall performance of the semiconductor structure can be improved.

One aspect of the present disclosure provides a semiconductor structure. The semiconductor structure comprises a substrate including a first surface and a second surface opposite to the first surface; a first dielectric layer disposed on the first surface of the substrate; a second dielectric layer disposed on the second surface of the substrate; a conductive via extending through the substrate and partially through the first dielectric layer and the second dielectric layer; a third dielectric layer disposed within the second dielectric layer and surrounding a portion of the conductive via; and a bump pad disposed over the third dielectric layer and the conductive via, wherein a dielectric constant of the third dielectric layer is substantially different from a dielectric constant of the second dielectric layer.

One aspect of the present disclosure provides a method of manufacturing a semiconductor structure. The method includes steps of providing a carrier; disposing an intermediate structure over the carrier, wherein the intermediate structure includes a first dielectric layer, a substrate over the first dielectric layer, and a conductive via extending through the substrate and partially through the first dielectric layer; removing a first portion of the substrate to partially expose the conductive via; forming a second dielectric layer over the substrate and a portion of the conductive via exposed through the substrate; removing a second portion of the second dielectric layer to partially expose the conductive via; forming a third dielectric layer conformal to the second dielectric layer and the portion of the conductive via exposed through the second dielectric layer; and forming a bump pad surrounded by the third dielectric layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
    a substrate including a first surface and a second surface opposite to the first surface;
    a first dielectric layer disposed on the first surface of the substrate;
    a second dielectric layer disposed on the second surface of the substrate;
    a conductive via extending through the substrate and partially through the first dielectric layer and the second dielectric layer;
    a third dielectric layer disposed within the second dielectric layer and surrounding a portion of the conductive via; and
    a bump pad disposed over the third dielectric layer and the conductive via,
    wherein a dielectric constant of the third dielectric layer is substantially different from a dielectric constant of the second dielectric layer.

2. The semiconductor structure of claim 1, wherein the dielectric constant of the third dielectric layer is substantially less than the dielectric constant of the second dielectric layer.

3. The semiconductor structure of claim 1, wherein the dielectric constant of the third dielectric layer is substantially less than or equal to 2.5.

4. The semiconductor structure of claim 1, wherein the dielectric constant of the second dielectric layer is substantially greater than 3.

5. The semiconductor structure of claim 1, wherein a hardness of the third dielectric layer is substantially less than a hardness of the second dielectric layer.

6. The semiconductor structure of claim 1, wherein the third dielectric layer is organic, and the second dielectric layer is inorganic.

7. The semiconductor structure of claim 1, wherein the third dielectric layer includes polyimides (PI), polytetrafluoroethene (PTFE), benzocyclobutene (BCB), polybenzobisoxazole (PBO) or polymer.

8. The semiconductor structure of claim 1, wherein the second dielectric layer includes silicon nitride, silicon oxide or silicon oxynitride.

9. The semiconductor structure of claim 1, wherein an interface is disposed between the second dielectric layer and the third dielectric layer.

10. The semiconductor structure of claim 1, wherein a thickness of the second dielectric layer is substantially greater than a thickness of the third dielectric layer.

11. The semiconductor structure of claim 1, wherein the bump pad includes a metallic liner disposed conformal to the third dielectric layer, a barrier layer disposed conformal to the metallic liner and over the conductive via, and a conductive member disposed over and surrounded by the barrier layer and the metallic liner.

12. The semiconductor structure of claim 1, wherein the bump pad is surrounded by the second dielectric layer and the third dielectric layer.

13. The semiconductor structure of claim 1, further comprising:
    a conductive pad surrounded by the first dielectric layer and electrically coupled to the conductive via;
    a conductive bump disposed on the bump pad and electrically connected to the conductive via through the bump pad.

14. A method of manufacturing a semiconductor structure, comprising:
    providing a carrier;
    disposing an intermediate structure over the carrier, wherein the intermediate structure includes a first dielectric layer, a substrate over the first dielectric layer, and a conductive via extending partially through the substrate and the first dielectric layer;
    removing a first portion of the substrate to partially expose the conductive via;
    forming a second dielectric layer over the substrate and a portion of the conductive via exposed through the substrate;
    removing a second portion of the second dielectric layer to partially expose the conductive via;
    forming a third dielectric layer conformal to the second dielectric layer and a portion the conductive via exposed through the second dielectric layer; and
    forming a bump pad surrounded by the third dielectric layer.

15. The method of claim 14, wherein the third dielectric layer is disposed by spin coating.

16. The method of claim 14, wherein at least a portion of the conductive via protrudes from the second dielectric layer after the removal of the second portion of the second dielectric layer.

17. The method of claim 14, wherein the formation of the third dielectric layer is performed after the formation of the second dielectric layer.

18. The method of claim 14, wherein the formation of the third dielectric layer and the formation of the second dielectric layer are performed separately.

19. The method of claim 14, further comprising:
- removing a third portion of the third dielectric layer to partially expose the conductive via;
- removing the third dielectric layer from the substrate;
- forming a conductive bump on the bump pad;
- removing the carrier from the first dielectric layer.

20. The method of claim 14, wherein the formation of the bump pad includes:
- forming a metallic liner conformal to the third dielectric layer;
- removing a third portion of the third dielectric layer and a fourth portion of the metallic liner to partially expose the conductive via;
- forming a barrier layer conformal to the metallic liner and the conductive via;
- disposing conductive material over the barrier layer to form a conductive member.

\* \* \* \* \*